US010991418B2

(12) United States Patent
Haraguchi et al.

(10) Patent No.: US 10,991,418 B2
(45) Date of Patent: Apr. 27, 2021

(54) SEMICONDUCTOR MEMORY DEVICE COMPRISING AN INTERFACE CONFORMING TO JEDEC STANDARD AND CONTROL DEVICE THEREFOR

(71) Applicant: Zentel Japan Corporation, Tokyo (JP)

(72) Inventors: Masaru Haraguchi, Tokyo (JP); Takashi Kubo, Tokyo (JP); Yasuhiko Tsukikawa, Tokyo (JP); Hironori Iga, Tokyo (JP); Kenichi Yasuda, Tokyo (JP); Takeshi Hamamoto, Tokyo (JP)

(73) Assignee: ZENTEL JAPAN CORPORATION, Tokyo (JP)

( * ) Notice: Subject to any disclaimer, the term of this patent is extended or adjusted under 35 U.S.C. 154(b) by 0 days.

(21) Appl. No.: 16/491,899

(22) PCT Filed: Mar. 6, 2017

(86) PCT No.: PCT/JP2017/008821
§ 371 (c)(1),
(2) Date: Sep. 6, 2019

(87) PCT Pub. No.: WO2018/163252
PCT Pub. Date: Sep. 13, 2018

(65) Prior Publication Data
US 2020/0135261 A1 Apr. 30, 2020

(51) Int. Cl.
*G06F 13/00* (2006.01)
*G11C 11/4093* (2006.01)
(Continued)

(52) U.S. Cl.
CPC ...... *G11C 11/4093* (2013.01); *G06F 12/0646* (2013.01); *G06F 13/1668* (2013.01);
(Continued)

(58) Field of Classification Search
CPC .......... G11C 11/40937; G11C 11/1006; G11C 7/109; G11C 8/12; G11C 11/4087;
(Continued)

(56) References Cited

U.S. PATENT DOCUMENTS

| 5,598,372 A * | 1/1997 | Matsumoto ............ G09G 5/393 365/230.01 |
| 5,732,010 A * | 3/1998 | Takashima ............... G11C 7/18 257/E27.085 |
| 5,886,944 A * | 3/1999 | Ahn ..................... G11C 7/1021 365/230.06 |
| 6,449,201 B1 * | 9/2002 | Kojima .................... G11C 7/12 365/205 |

(Continued)

FOREIGN PATENT DOCUMENTS

EP          0214050 A2 * 3/1987 ............... G11C 7/00
JP          11353227 A * 12/1999
(Continued)

*Primary Examiner* — Jing-Yih Shyu
(74) *Attorney, Agent, or Firm* — Chen Yoshimura LLP

(57) ABSTRACT

A control device of the invention for a semiconductor memory device comprising an interface conforming to JEDEC standard of DDRx-SDRAM or LPDDRx-SDRAM, comprises banks, a read/write control circuit, and a transfer control circuit. Each bank comprises subarrays. Each subarray comprises memory cells arranged along bit lines and word lines. The read/write control circuit controls reading of data from and writing of data to the semiconductor memory device. The transfer control circuit controls data transfer inside the semiconductor memory device and sets to enable an additional transfer command not specified in the JEDEC standard and a transfer command for writing data, read from a transfer source memory cell, to a transfer destination memory cell without passing outside the semiconductor memory device by transmitting a first signal value not used in the JEDEC standard to the semiconductor memory device via at least one signal line of the interface.

33 Claims, 21 Drawing Sheets

(51) Int. Cl.
*G06F 12/06* (2006.01)
*G06F 13/16* (2006.01)
*G11C 11/4072* (2006.01)
*G11C 11/408* (2006.01)
*G11C 11/4091* (2006.01)
*G11C 11/4096* (2006.01)

(52) U.S. Cl.
CPC ...... *G11C 11/4072* (2013.01); *G11C 11/4085* (2013.01); *G11C 11/4091* (2013.01); *G11C 11/4096* (2013.01); *G06F 2212/1008* (2013.01)

(58) Field of Classification Search
CPC ............ G11C 11/4072; G11C 11/4085; G11C 11/4091; G11C 11/4096; G06F 12/0646; G06F 13/1668; G06F 2212/1008; G06F 12/00; G06F 12/02; G06F 12/06
See application file for complete search history.

(56) References Cited

U.S. PATENT DOCUMENTS

| 2002/0031035 | A1* | 3/2002 | Tsuji | G11C 8/12 365/230.03 |
| 2002/0069026 | A1* | 6/2002 | Endo | G01R 31/31701 702/117 |
| 2004/0076054 | A1* | 4/2004 | Takahashi | G11C 11/40615 365/200 |
| 2012/0239887 | A1* | 9/2012 | Magro | G06F 13/1673 711/154 |

FOREIGN PATENT DOCUMENTS

| JP | 2000156078 A | * | 6/2000 |
| JP | 2009163394 A | * | 7/2009 |

* cited by examiner

| Burst1 | DQ15 | DQ14 | DQ13 | DQ12 | DQ11 | DQ10 | DQ9 | DQ8 | DQ7 | DQ6 | DQ5 | DQ4 | DQ3 | DQ2 | DQ1 | DQ0 | Hexadecimal notation |
|---|---|---|---|---|---|---|---|---|---|---|---|---|---|---|---|---|---|
| 0 | 0 | 0 | 0 | 0 | 0 | 1 | 0 | 0 | 0 | 0 | 0 | 0 | 0 | 0 | 0 | 0 | → 0x0400 |
| 1 | 0 | 0 | 0 | 0 | 0 | 0 | 0 | 0 | 0 | 0 | 0 | 0 | 0 | 0 | 0 | 0 | → 0x0000 |
| 2 | 0 | 0 | 0 | 0 | 0 | 0 | 0 | 0 | 0 | 0 | 0 | 0 | 0 | 0 | 0 | 0 | |
| 3 | 0 | 0 | 0 | 0 | 0 | 0 | 0 | 0 | 0 | 0 | 0 | 0 | 0 | 0 | 0 | 0 | |
| 4 | 0 | 0 | 0 | 0 | 0 | 0 | 0 | 0 | 0 | 0 | 0 | 0 | 0 | 0 | 0 | 0 | |
| 5 | 0 | 0 | 0 | 0 | 0 | 0 | 0 | 0 | 0 | 0 | 0 | 0 | 0 | 0 | 0 | 0 | |
| 6 | 0 | 0 | 0 | 0 | 0 | 0 | 0 | 0 | 0 | 0 | 0 | 0 | 0 | 0 | 0 | 0 | |
| 7 | 0 | 0 | 0 | 0 | 0 | 0 | 0 | 0 | 0 | 0 | 0 | 0 | 0 | 0 | 0 | 0 | |

| Burst i | DQ15 | DQ14 | DQ13 | DQ12 | DQ11 | DQ10 | DQ9 | DQ8 | DQ7 | DQ6 | DQ5 | DQ4 | DQ3 | DQ2 | DQ1 | DQ0 | Hexadecimal notation |
|---|---|---|---|---|---|---|---|---|---|---|---|---|---|---|---|---|---|
| 0 | 0 | 0 | 0 | 0 | 1 | 0 | 0 | 0 | 0 | 0 | 0 | 0 | 0 | 0 | 0 | 0 | → 0x0800 |
| 1 | 0 | 0 | 0 | 0 | 0 | 0 | 0 | 0 | 0 | 0 | 0 | 0 | 0 | 0 | 0 | 0 | → 0x0000 |
| 2 | 0 | 0 | 0 | 0 | 0 | 1 | 1 | 0 | 1 | 0 | 1 | 1 | 0 | 0 | 0 | 0 | → 0x02B0 |
| 3 | 0 | 0 | 0 | 0 | 0 | 1 | 0 | 1 | 0 | 1 | 0 | 1 | 0 | 0 | 0 | 0 | → 0x0550 |
| 4 | 0 | 0 | 0 | 0 | 0 | 0 | 0 | 0 | 0 | 0 | 0 | 0 | 0 | 0 | 0 | 0 | |
| 5 | 0 | 0 | 0 | 0 | 0 | 0 | 0 | 0 | 0 | 0 | 0 | 0 | 0 | 0 | 0 | 0 | |
| 6 | 0 | 0 | 0 | 0 | 0 | 0 | 0 | 0 | 0 | 0 | 0 | 0 | 0 | 0 | 0 | 0 | |
| 7 | 0 | 0 | 0 | 0 | 0 | 0 | 0 | 0 | 0 | 0 | 0 | 0 | 0 | 0 | 0 | 0 | |

| Command | Address upper bits | Transfer source | Transfer destination |
|---|---|---|---|
| Write | HLL | Memory control device 3 | Bank 31—0~31—7 |
| | HLH | Memory control device 3 | Register 82 |
| | HHL | Register 84 | Bank 31—0~31—7 |
| | HHH | Memory control device 3 | Register 84 |
| Read | HLL | Bank 31—0~31—7 | Memory control device 3 |
| | HLH | Bank 31—0~31—7 | Register 82 |
| | HHL | Register 84 | Memory control device 3 |
| | HHH | Bank 31—0~31—7 | Register 84 |

FIG. 19

SEMICONDUCTOR MEMORY DEVICE COMPRISING AN INTERFACE CONFORMING TO JEDEC STANDARD AND CONTROL DEVICE THEREFOR

FIELD OF THE INVENTION

The invention relates to a control device, a semiconductor memory device and a control method for the semiconductor memory device.

BACKGROUND OF THE INVENTION

Herein, DDRx-SDRAM refers to DDR-SDRAM (Double Data Rate Synchronous Dynamic Random-Access Memory), DDR2-SDRAM, DDR3-SDRAM, DDR4-SDRAM, and their derivatives and successor devices. Also, in this specification, LPDDRx-SDRAM refers to LPDDR-SDRAM (Low Power DDR-SDRAM), LPDDR2-SDRAM, LPDDR3-SDRAM, LPDDR4-SDRAM, and their derived standard and successor standard.

Generally, when transferring data, which are stored in a first memory block having a first address in an external memory, to a second memory block having a second address in the same memory, the memory controller continuously reads the data in the first memory block and temporarily stores the data into a buffer in a processor chip, and then, the data is read out from the buffer controlled by the memory controller, and then, the data is continuously written into the second memory block. In such a memory data transfer process in the memory system, an interface between the processor and the memory is occupied only for the data transfer and no operation or processing is performed on the data, and a large amount of bandwidth, power and time are consumed wastefully.

In recent years, applications that handle a large amount of data, such as the Internet of Things (IoT) and Big Data, have become popular. In such applications, such internal memory system processes, transferring or copying a large amount of data from a memory block of a memory to another block of the same memory, initializing specific data stored in a memory block in the memory, and the like can frequently occur. By the internal memory system processes, the interface, between the processor and the memory, is used only for such internal memory data transfer tastefully, thereby, performance and energy efficiency of the memory system can be significantly declined.

For solving such a problem, U.S. Pat. No. 9,116,856 shows a new idea of DDR memory controller to store data which is read from a memory for transferring, or copying the data in a local memory, which is embedded in the memory controller without sending the data to a system bus attached to the memory. By the idea, a data transfer, between the memory and the local memory in the memory controller does not occupy the system bus for transferring or copying data, and reduces amount of information communicated via the system bus.

Further, four prior art documents, U.S. Pat. Nos. 5,381,368A, 5,440,517A, and 5,886,944A, show that there are several data transfer methods utilizing the characteristics of DRAMs. In a DRAM, a plurality of memory cells is arranged along a plurality of complementary bit line pairs and a plurality of word lines orthogonal to the complementary bit line pairs. A charge representing data is stored in a capacitor of each memory cell. Here, as for an example, a charge represents the data "1", and no charge represents the data "0". In a DDRx-SDRAM or LPDDRx-SDRAM, by performing row access using an ACT command, a word line corresponding to an input address is asserted, and a charge of a memory cell which is connected to the asserted word line is transferred to a corresponding bit-line of a pre-charged complementary bit line pair. At this time, a slight potential difference is generated on the complementary bit line pair. A sense amplifier, connected to the complementary bit line pair, amplifies the slight potential difference for setting a bit-line potential level to a power supply level and to set another bit-line potential level to a ground level. In a normal DRAM, after the amplification of the slight data on the complementally bit-line pair by the sense amplifier, a column select line, which is corresponding to an input address, is asserted to perform data read or write, by performing column access with a read command or a write command, respectively. The point of the prior arts is that another word line, which is connected to the same complementary bit line pairs via corresponding memory cells, is asserted while the data amplified by the sense amplifier are kept on the corresponding complementary bit line pairs. This makes it possible to copy a large amount of data from memory cells of one word line address to memory cells of another word line address without passing through the outside of memory array in a DRAM.

Furthermore, a non-patent document, entitled "Row-Clone: Fast and Energy-efficient In-DRAM Bulk Data Copy and Initialization", discloses that data can be transferred between banks without passing outside the DRAM by adding a special command.

However, when using a widely spread JEDEC (Joint Electron Device Engineering Council) standard DRAM having already standardized interface and functionalities, data have to pass through a bus outside of the DRAM to transfer or copy the data; as explained, it consumes a large power and a long time.

In recent years, interfaces of JEDEC DRAMs such as DDR3-SDRAMs and DDR4-SDRAMs run at very high operating frequency. In a case where a DRAM performing special operations in such high operating frequencies, as in memory data transfer or data copy explained above, when using another signal or other signals deviating from the signal group of the interface defined by the JEDEC standard, it would be difficult to use low cost commodity parts; this may lead to soaring development costs by unique pin arrangement of a memory package, a unique memory control device having additional functions, and a unique DDR PHY and required sensitive wirings on a high frequency print-board, etc.

SUMMARY OF THE INVENTION

One aspect of the present invention is to provide a semiconductor memory device and a control device, having an interface conforming to the JEDEC standard of DDRx-SDRAM or LPDDRx-SDRAM, which transfers or copies data without occupying a bus outside the semiconductor memory device, and is to provide a control method for such a semiconductor memory device.

In this specification, as an external primary data storage device for a processor such as a computer, a semiconductor storage system comprising a semiconductor memory device such as a DRAM etc., and a control device is used.

According to a control device of a first aspect of the invention, for a semiconductor memory device comprising an interface conforming to JEDEC (Joint Electron Device Engineering Council) standard of DDRx-SDRAM or LPDDRx-SDRAM, the control device comprises a plurality of banks, a read/write control circuit, and a transfer control circuit. The banks are connected to one another by an internal data bus, and each bank, separated from one another by at least one sense amplifier row comprising a plurality of sense amplifiers, comprises a plurality of subarrays. Each subarray comprises a plurality of memory cells arranged along a plurality of bit lines and a plurality of word lines orthogonal to the bit lines. The read/write control circuit controls reading of data from the semiconductor memory device and writing of data to the semiconductor memory device. The transfer control circuit controls data transfer inside the semiconductor memory device and sets to enable an additional transfer command not specified in the JEDEC standard and a transfer command for writing data, read from a transfer source memory cell, to a transfer destination memory cell without passing outside the semiconductor memory device by transmitting a first signal value not used in the JEDEC standard to the semiconductor memory device via at least one signal line of the interface.

According to a semiconductor memory device of a second aspect of the invention, comprising an interface conforming to JEDEC standard of DDRx-SDRAM or LPDDRx-SDRAM, the semiconductor memory device comprises an internal bus, a plurality of banks, a data input/output circuit, and a command input circuit. The banks are connected to one another by the internal data bus, and each of the banks, separated from one another by at least one sense amplifier row comprising a plurality of sense amplifiers, comprises a plurality of subarrays. Each of the subarrays comprising a plurality of memory cells arranged along a plurality of bit lines and a plurality of word lines orthogonal to the bit lines. The data input/output circuit, connected to a control device via the interface and connected to the banks via the internal data bus, transmits/receives data between the control device and the banks. The command input circuit is connected to the control device via the interface and receives a command for controlling the banks from the control device. The command input circuit, by receiving from the control device a first signal value not used in the JEDEC standard via at least one signal line of the interface, enables an additional transfer command which is not defined in the JEDEC standard but is a transfer command to write data, read from a transfer source memory cell, to a transfer destination memory cell without passing outside the semiconductor memory device.

According to a control method of a third aspect of the invention, for a semiconductor memory device comprising an interface conforming to JEDEC standard of DDRx-SDRAM or LPDDRx-SDRAM and a plurality of banks connected to one another by an internal data bus, each bank being separated from one another by at least one sense amplifier row comprising a plurality of sense amplifiers, each bank comprising a plurality of subarrays, and each subarray comprising a plurality of memory cells arranged along a plurality of bit lines and a plurality of word lines orthogonal to the bit lines, the control method comprises a step of enabling an additional transfer command not specified in the JEDEC standard and a transfer command to write data, read from a transfer source memory cell to a transfer destination memory cell without passing outside the semiconductor memory device by receiving from a control device a first signal value not used in the JEDEC standard via at least one signal line of the interface.

BRIEF DESCRIPTION OF THE DRAWINGS

Various objects and advantages of the present invention will be more readily understood from the following detailed description when read in conjunction with the appended drawing, in which:

FIG. 6: A table showing a first example of subarray information transmitted from the memory 5 of FIG. 1 to the memory control device 3;

FIG. 7: A table showing a second example of subarray information transmitted from the memory 5 of FIG. 1 to the memory control device 3;

FIG. 19: A table showing an operation according to a write command and a read command transmitted from the memory control device 3 in the memory 5B of FIG. 18;

DESCRIPTION OF EMBODIMENTS OF THE INVENTION

Figure 1:
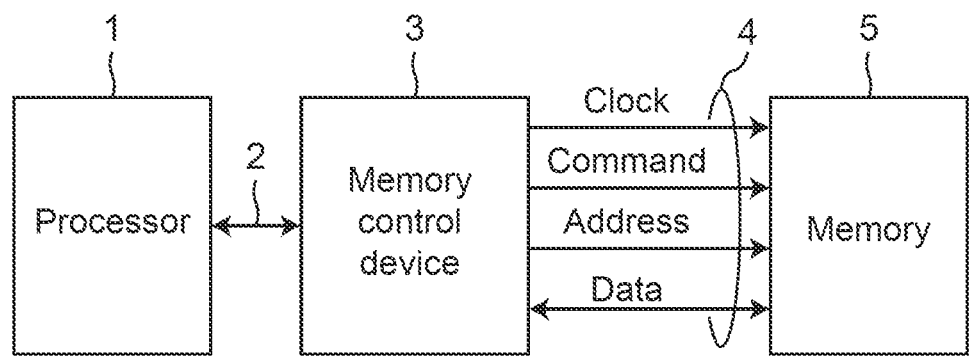
FIG. 1: A block diagram showing a processing apparatus including a memory system according to a first embodiment.

For a more complete understanding of the present disclosure and its advantages, reference is now made to the following description taken in conjunction with the accompanying drawings, in which like reference numbers indicate like features. Persons of ordinary skill in the art having the benefit of the present disclosure will understand other variations for implementing embodiments within the scope of the present disclosure, including those specific examples described herein. The drawings are not limited to specific scale and similar reference numbers are used for representing similar elements. As used in the disclosures and the appended claims, the terms "example embodiment," "exemplary embodiment," and "present embodiment" do not necessarily refer to a single embodiment, although it may, and various example embodiments may be readily combined and interchanged, without departing from the scope or spirit of the present disclosure. Furthermore, the terminology as used herein is for the purpose of describing example embodiments only and is not intended to be a limitation of the disclosure. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any and all possible combinations of one or more of the associated listed items.

According to a control device of a first aspect of the invention, in the control device thereof is for a semiconductor memory device including a set of interface protocol conforming to JEDEC (Joint Electron Device Engineering Council) standard of DDRx-SDRAM or LPDDRx-SDRAM; the semiconductor memory device is composed of banks which are connected each other by internal data bus; each one bank of the banks includes subarrays separated from one another by at least one sense amplifier-row comprising a plurality of sense amplifiers; each one subarray of the subarrays includes a plurality of memory cells which is arranged along a plurality of bit lines and a plurality of word lines orthogonal to the bit lines; the control device includes a read/write control circuit that controls data-read from the semiconductor storage memory device and data-write to the semiconductor storage memory device, and a transfer control circuit that controls data transfer inside the semiconductor memory device; by transmitting a first signal value, which is not used in the JEDEC standard, the transfer control circuit sets an additional command kept as a reserved value of the JEDEC standard to be usable as a transfer command to write data read from a transfer source memory cell to a transfer destination memory cell of the semiconductor memory device via at least one signal line of the interface without passing outside the semiconductor memory device.

According to a control device of a second aspect of the invention, in the control device thereof is the first aspect of the invention, wherein when the transfer control circuit transmits a mode-register-set-command of the JEDEC standard to the semiconductor memory device, the transfer control circuit transmits the first signal value to the semiconductor memory device via a signal line of a bank address of the interface.

According to a control device of a third aspect of the invention, in the control device thereof is the first aspect of the invention or the second aspect of the invention, wherein the transfer command includes a word line activation command for activating one word line without activating the sense amplifiers.

According to a control device of a fourth aspect of the invention, in the control device thereof is the third aspect of the invention, wherein the transfer control circuit invalidates a ZQ calibration command of the JEDEC standard, and sets a bit-value which is assigned to the ZQ calibration command to be usable as a bit-value for the word line activation command.

According to a control device of a fifth aspect of the invention, in the control device thereof is the first aspect of the invention or the second aspect of the invention, wherein the transfer command includes a sense amplifier activation command for activating the sense amplifiers of one subarray without activating a word line.

According to a control device of a sixth aspect of the invention, in the control device thereof is the fifth aspect of the invention, wherein when transmitting the mode register set command of the JEDEC standard to the semiconductor memory device by transmitting a second signal value to the semiconductor memory device via a signal line of the bank address of the interface, the transfer control circuit sets the bit value assigned to the mode-register-set-command to be usable as the bit value of the sense amplifier activation command.

According to a control device of a seventh aspect of the invention, in the control device thereof is the first aspect of the invention or the second aspect of the invention, wherein the transfer command further includes a transfer read command and a transfer write command for writing data which is read out from a first group of a memory cell in a transfer source subarray into a second group of another memory cell in a transfer destination subarray, without passing through outside of the semiconductor memory device.

According to a control device of an eighth aspect of the invention, in the control device thereof is the seventh aspect of the invention, wherein when disabling burst chops command of the JEDEC standard, "Burst chop command," and auto pre-charge command of the JEDEC standard, "Auto pre-charge command," and write command of the JEDEC standard, "Read/Write commands," and transmitting the JEDEC standard "Read/Write commands" to the semiconductor memory device, the transfer control circuit sets bit values assigned to the "Read/Write commands" of the JEDEC standard to be usable as bit values of the transfer read command and the transfer write command by transmitting a third signal value to the semiconductor memory device via at least one of a plurality of signal lines for a column address of the interface, respectively.

According to a ninth aspect of the invention, in the control device thereof is the third aspect of the invention or the fourth aspect of the invention, wherein when transferring data inside of one subarray of the subarrays in one of the banks, the transfer control circuit transmits the activation command of the JEDEC standard for activating one word line and the sense amplifiers of a subarray including the activated word line to the semiconductor memory device, and transmits a row address of the word line including the transfer destination memory cell to the semiconductor memory device, and transmits pre-charge command of the JEDEC standard to the semiconductor memory device.

According to a control device of a tenth aspect of the invention, in the control device thereof is the seventh aspect of the invention or the eighth of the invention, wherein the transfer command further includes a word line activation command that activates one word line without activating the sense amplifiers and a sense amplifier activation command that activates the sense amplifiers of one subarray without activating a word line; when transferring data between different subarrays in one of the plurality of banks, commands and addresses submitted by the transfer control circuit to the semiconductor memory device comprise: word linean activation command of the JEDEC standard, for activating a word line and the sense amplifiers of one of the subarrays including the activated word line; a row address of the word line including a transfer source memory cell; a row address of the sense amplifiers of the subarray including another word line including the transfer destination memory cell; the transfer read command and a column address; the transfer write command and another column address; the word line activation command and the row address of the word line including the transfer destination memory cell; and a pre-charge command of the JEDEC standard.

According to a control device of an eleventh aspect of the invention, in the control device thereof is the seventh aspect of the invention or the eighth aspect of the invention, wherein when transferring data between different subarrays in the different banks, commands and addresses transmitted by the transfer control circuit to the semiconductor memory device comprise: an activation command of the JEDEC standard, to activate the one word line and the sense amplifiers of a subarray including the activated word line; a row address of a word line including the transfer source memory cell; a row address of a word line including the activation command of the JEDEC standard and the transfer destination memory cell; the transfer read command and a column address; the transfer write command and another column address; a pre-charge command of the JEDEC standard.

According to a control device of a twelfth aspect of the invention, in the control device thereof is one of the first to eleventh aspects of the invention, wherein the transfer control circuit receives subarray information indicating a range of row addresses included in each of the subarrays in each bank from the semiconductor memory device via at least one signal line of the interface.

According to a control device of a thirteenth aspect of the invention, in the control device thereof is the twelfth aspect of the invention, wherein the transfer control circuit receives the subarray information from a multipurpose register of the semiconductor memory device using a mode register read command of the JEDEC standard.

According to a control device of a fourteenth aspect of the invention, in the control device thereof is the twelfth aspect of the invention or the thirteenth aspect of the invention, wherein the subarray information includes a number of row addresses included in one cycle of one or more subarrays periodically arranged in each one of banks, and another number of row addresses, which is counted from a beginning of the cycle to a beginning of each subarray included in the cycle.

According to a control device of a fifteenth aspect of the invention, in the control device thereof is one of the twelfth to fourteenth aspects of the invention, wherein the transfer control circuit comprises: a transfer source address register, storing a transfer source bank address and a row address of a transfer source bank received from a processor connected to the transfer control circuit, a transfer destination address register, storing a bank address and a row address of a transfer destination bank received from the processor, a transfer page number register, storing a number of pages of transfer data received from the processor, a subarray information register, storing the subarray information received from the semiconductor memory device; and an address comparison circuit, determining whether to transfer data inside a same subarray and whether to transfer data inside a same bank based on stored information in the transfer source address register, the transfer destination address register, the transfer page number register, and the subarray information register.

According to a control device of a sixteenth aspect of the invention, in the control device thereof is one of the first to fifteenth aspects of the invention, wherein the transfer control circuit comprises a transfer start trigger register storing a transfer start trigger received from a processor connected to the transfer control circuit, and a selector connecting one of the read/write control circuit and the transfer control circuit to the semiconductor memory device according to presence or absence of the transfer start trigger stored in the transfer start trigger register.

According to a control device of a seventeenth aspect of the invention, in the control device thereof is one of the first to sixteenth aspects of the invention, wherein the semiconductor memory device further includes at least one register connected to the internal data bus, and the transfer control circuit transfers data via the register when transferring data between different subarrays in different banks.

According to a control device of an eighteenth aspect of the invention, in the control device thereof is one of the first to sixteenth aspects of the invention, wherein the semiconductor memory device further includes at least one register and an arithmetic circuit connected to the internal data bus, and the transfer control circuit performs an operation on data read from one of the plurality of banks by the operation circuit, and writes data after the operation to one of the plurality of banks.

According to a control device of a nineteenth aspect of the invention, in the control device thereof is the eighteenth aspect of the invention, wherein when transmitting a mode register set command of the JEDEC standard to the semiconductor memory device, the arithmetic circuit transmits an operation code of an operation by the arithmetic circuit to the semiconductor memory device via an address signal line of the interface.

According to a semiconductor memory device of the twentieth aspect of the present invention, wherein the semiconductor memory device has an interface conforming to the JEDEC (Joint Electron Device Engineering Council) standard of DDRx-SDRAM or LPDDRx-SDRAM, the semiconductor memory device includes an internal data bus; a plurality of banks connected to one another by the internal data bus, and each one bank of the banks includes subarrays being separated from one another by at least one sense amplifier row comprising a plurality of sense amplifiers, each bank comprising a plurality of subarrays, and each subarray including a plurality of memory cells arranged along a plurality of bit lines and a plurality of word lines orthogonal to the bit lines; a data input/output circuit, connected to a control device via the interface and connected to the banks via the internal data bus, transmitting and receiving data between the control device and the plurality of banks; and a command input circuit, connected to the control device via the interface and receiving a command for controlling the plurality of banks from the control device; wherein the command input circuit, by receiving a first signal value which is not used in the JEDEC standard from the control device via at least one signal line of the interface, enables an additional transfer command not specified in the JEDEC standard but is a transfer command to write data, read from a transfer source memory cell, to a transfer destination memory cell without passing outside the semiconductor memory device.

According to a semiconductor memory device of a twenty-first aspect of the invention, in the semiconductor memory device thereof is the twentieth aspect of the invention, wherein when a mode-register-set-command of the JEDEC standard is received from the control device, the command input circuit receives the first signal value from the control device via a signal line of a bank address of the interface.

According to a semiconductor memory device of a twenty-second aspect of the invention, in the semiconductor memory device thereof is the twentieth of the invention or the twenty-first of the invention, wherein the transfer command includes a word line activation command for activating one word line without activating the sense amplifiers.

According to a semiconductor memory device of a twenty-third aspect of the invention, in the semiconductor memory device thereof is the twenty-second of the invention, wherein the command input circuit invalidates a ZQ calibration command of the JEDEC standard, and sets a bit value assigned to the ZQ calibration command to be usable as a bit value of the word line activation command.

According to a semiconductor memory device of a twenty-fourth aspect of the invention, in the semiconductor memory device thereof is the twentieth of the invention or the twenty-first of the invention, wherein the transfer command includes a sense amplifier activation command for activating the sense amplifiers of one subarray without activating a word line.

According to a semiconductor memory device of a twenty-fifth aspect of the invention, in the semiconductor memory device thereof is the twenty-fourth of the invention, wherein when receiving a mode register set command of the JEDEC standard from the control device, and by receiving a second signal value from the control device via a signal line of a bank address of the interface, the command input circuit sets a bit value assigned to the mode register set command to be usable as a bit value of the sense amplifier activation command.

According to a semiconductor memory device of a twenty-sixth aspect of the invention, in the semiconductor memory device thereof is the twentieth of the invention or the twenty-first of the invention, wherein the transfer command further includes a transfer read command and a transfer write command for writing data, read from a memory cell of a transfer source subarray, into a memory cell of a transfer destination subarray without passing outside the semiconductor memory device.

According to a semiconductor memory device of a twenty-seventh aspect of the invention, in the semiconductor memory device thereof is the twenty-sixth of the invention, wherein the command input circuit is configured to: invalidating burst chops command of the JEDEC standard, "Burst chop command," and auto pre-charge command of the JEDEC standard, "Auto pre-charge command," assigned as read and write command of the JEDEC standard, "Read/Write commands"; receiving the "Read/Write commands" of the JEDEC standard from the control device; and by receiving a third signal value from the control device via at least one of the plurality of signal lines of the column address of the interface, setting bit values assigned to the "Read/Write commands" of the JEDEC standard to be usable as bit values as the transfer read command and the transfer write command, respectively.

According to a semiconductor memory device of a twenty-eighth aspect of the invention, in the semiconductor memory device thereof is the twenty-second of the invention or the twenty-third of the invention, wherein and addresses received by the command input circuit from the control device comprise: an activation command of the JEDEC standard, for activating one word line and the sense amplifiers of a subarray including the one activated word line; a row address of a word line including a memory cell of a transfer source; the word line activation command; a row address of a word line including a memory cell of a transfer destination; and a pre-charge command of the JEDEC standard; thereby, data is transferred within one of the plurality of subarrays in one of the plurality of banks.

According to a semiconductor memory device of a twenty-ninth aspect of the invention, in the semiconductor memory device thereof is the twenty-sixth of the invention or the twenty-seventh of the invention, wherein the transfer command further includes a word line activation command for activating one word line without activating a sense amplifier, and a sense amplifier activation command for activating the sense amplifiers of one subarray without activating a word line, and commands and addresses received by the command input circuit comprise: an activation command of the JEDEC standard, for activating one word line and the sense amplifiers of a subarray including the activated word line; a row address of a word line including the transfer source memory cell; the sense amplifier activation command and a row address of a sense amplifier of a subarray including a word line including the transfer destination memory cell; the transfer read command and a column address; the transfer write command and another column address; and the word line activation command and a row address of a word line including the transfer destination memory cell; thereby, data is transferred between different subarrays in one of the plurality of banks and within one of the subarrays in one of the banks.

According to a semiconductor memory device of a thirtieth aspect of the invention, in the semiconductor memory device thereof is the twenty-sixth of the invention or the twenty-seventh of the invention, wherein commands and addresses received by the command input circuit from the control device comprise: an activation command of the JEDEC standard, for activating a word line and a sense amplifier of a subarray including the activated word line and a row address of a word line including the transfer source memory cell; the activation command and a row address of a word line including the transfer destination memory cell; the transfer read command and a column address; the transfer write command and another column address; and a pre-charge command of the JEDEC standard; thereby, data is transferred between different subarrays in different ones of the plurality of banks.

According to a semiconductor memory device of a thirty-first aspect of the invention, in the semiconductor memory device thereof is one of the twentieth to thirtieth of the invention, wherein the command input circuit transmits subarray information indicating a range of row addresses included in each of the subarrays in each bank to the control device via at least one signal line of the interface.

According to a semiconductor memory device of a thirty-second aspect of the invention, in the semiconductor memory device thereof is the thirty-first of the invention, wherein the command input circuit transmits the subarray information stored in a multipurpose register of the semiconductor memory device to the control device in response to a mode register read command of the JEDEC standard.

According to a semiconductor memory device of a thirty-third aspect of the invention, in the semiconductor memory device thereof is the thirty-first of the invention or the thirty-second of the invention, wherein the subarray information includes a number of row addresses included in one cycle of one or more subarrays periodically arranged in each one of banks and a number of row addresses from the beginning of the cycle to the beginning of each subarray included in the cycle.

According to a semiconductor memory device of a thirty-fourth aspect of the invention, in the semiconductor memory device thereof is one of the twentieth to thirty-third aspects of the invention, wherein the semiconductor memory device further includes at least one register connected to the internal data bus, and the command input circuit transfers data via the register when transferring data between different subarrays in different banks.

According to a semiconductor memory device of a thirty-fifth aspect of the invention, in the semiconductor memory device thereof is one of the twentieth to thirty-third aspects of the invention, wherein the semiconductor memory device further includes at least one register and an arithmetic circuit connected to the internal data bus, and the command input circuit performs an operation on data, read from one of the banks by the arithmetic circuit, and writes the data after the operation to one of the banks.

According to a semiconductor memory device of a thirty-sixth aspect of the invention, in the semiconductor memory device thereof is the thirty-fifth aspect of the invention, wherein when the arithmetic circuit receives a mode register set command of the JEDEC standard from the control device, the arithmetic circuit receives an operation code of the operation by the arithmetic circuit from the control device via the signal line of the address of the interface.

According to a control method for semiconductor memory device according to the thirty-seventh aspect of the invention, for a semiconductor memory device including an interface conforming to JEDEC standard of DDRx-SDRAM or LPDDRx-SDRAM, and a plurality of banks connected to one another by an internal data bus, each bank of the banks being separated from one another by at least one sense amplifier row comprising a plurality of sense amplifiers, each bank comprising a plurality of subarrays, and each subarray includes a plurality of memory cells which is arranged along a plurality of bit lines and a plurality of word lines orthogonal to the bit lines, the control method comprising a step of: enabling an additional command not specified in the JEDEC standard and a transfer command to write data, read from a transfer source memory cell, to a transfer destination memory cell without passing outside the semiconductor memory device by receiving from a control device a first signal value not used in the JEDEC standard via at least one signal line of the interface.

According to the invention, a semiconductor memory device and a control device having an interface conforming to the JEDEC standard of DDRx-SDRAM or LPDDRx-SDRAM, which transfers or copies data without occupying a bus outside the semiconductor memory device. The invention can provide a semiconductor memory device and a control device that can be used, and a semiconductor storage system that includes these.

According to a semiconductor storage system of a thirty-eighth aspect of the invention, the semiconductor storage system may include a control device of one of the first to the nineteenth aspects and the semiconductor memory device of one of the twentieth to thirty-six aspects.

Hereinafter, embodiments according to the invention will be described with reference to drawings.

Embodiment 1

FIG. 1 is a block diagram showing a processing device including a memory system according to the first embodiment. The processing device of FIG. 1 includes a processor 1, a processor bus 2, a memory control device 3, a memory bus 4, and a memory 5.

The processor 1 is connected to the memory control device 3 via the processor bus 2. The memory control device 3 is connected to the memory 5 via the memory bus 4. The memory 5 includes a plurality of banks each including a plurality of subarrays, as described later. The memory 5 has an interface conforming to a JEDEC (Joint Electron Device Engineering Council) standard of DDR3-SDRAM. The memory control device 3 and the memory 5 communicate with each other via the memory bus 4 using signals conforming to the JEDEC standard. Memory bus 4 includes signal lines of a clock bus, a command bus, an address bus, and a data bus. The memory control device 3 and the memory 5 operate as a memory system for the processor.

The memory 5 of the DDR3-SDRAM is an example of a semiconductor memory device. The memory control device 3 is an example of a control device for a semiconductor memory device. The memory system including the memory control device 3 and the memory 5 is an example of a semiconductor storage system.

Figure 2:
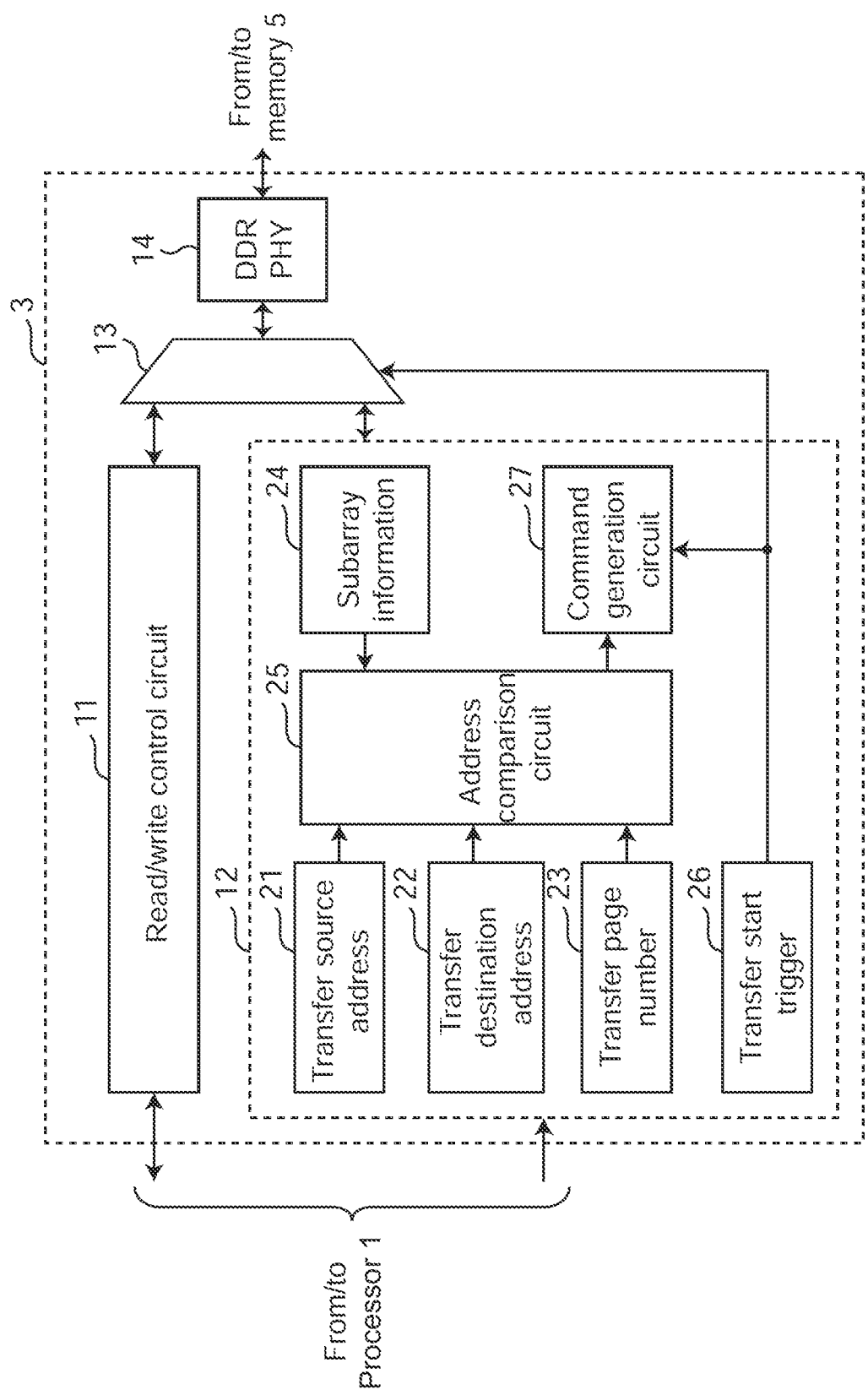
FIG. 2: A block diagram showing a configuration of a memory control device 3 of FIG. 1.

FIG. 2 is a block diagram showing the configuration of the memory control device 3 of FIG. 1. The memory control device 3 includes a read/write control circuit 11, a transfer control circuit 12, a selector 13, and a DDR physical layer circuit (DDR PHY) 14.

A "Read/Write" control circuit 11 controls reading of data from the memory 5 and writing of data to the memory 5 in accordance with the normal JEDEC standard.

A transfer control circuit 12 controls a data transfer inside the memory 5.

The selector 13 connects one of the "Read/Write" control circuit 11 and the transfer control circuit 12 to the memory 5 via a DDR physical layer circuit 14 under the control of the transfer control circuit 12. When the read/write control circuit 11 is connected to the memory 5, the memory control device 3 and the memory 5 operate in a normal mode for reading data from the memory 5 and/or writing data to the memory 5. When the transfer control circuit 12 is connected to the memory 5, the memory control device 3 and the memory 5 operate in a transfer mode for transferring data inside the memory 5 without passing through the outside of the memory 5.

The transfer control circuit 12 includes a transfer source address register 21, a transfer destination address register 22, a transfer page number register 23, a subarray information register 24, an address comparison circuit 25, a transfer start trigger register 26, and a command generation circuit 27.

The transfer source address register 21 stores the bank address and the row address of the transfer source received from the processor 1. The transfer destination address register 22 stores the bank address and the row address of the transfer destination received from the processor 1. The transfer page number register 23 stores the number of pages of data to be transferred received from the processor 1. These registers 21 to 23 are preset by the processor 1 before starting the data transfer.

The subarray information register 24 stores subarray information, described later, indicating the arrangement of a plurality of banks of the memory 5 and a plurality of subarrays, which are received in advance from the memory 5.

Based on the information stored in the transfer source address register 21, the transfer destination address register 22, the transfer page number register 23, and the subarray information register 24, the address comparison circuit 25 determines whether data is to be transferred within a same subarray and whether data is to be transferred within a same bank.

The transfer start trigger register 26 stores a transfer start trigger received from the processor 1. The selector 13 connects one of the read/write control circuit and the transfer control circuit 12 to the memory 5 in accordance with presence or absence of a transfer start trigger stored in the transfer start trigger register 26.

When the transfer start trigger is stored in the transfer start trigger register 26, the command generation circuit 27 issues a command for controlling a transfer of data in the memory 5. When transferring data inside a same subarray in a same bank, when transferring data between different subarrays of a same bank, and when transferring data between different subarrays of different banks, the command generation circuit 27 automatically determines the sequence of commands to be issued.

Figure 3:
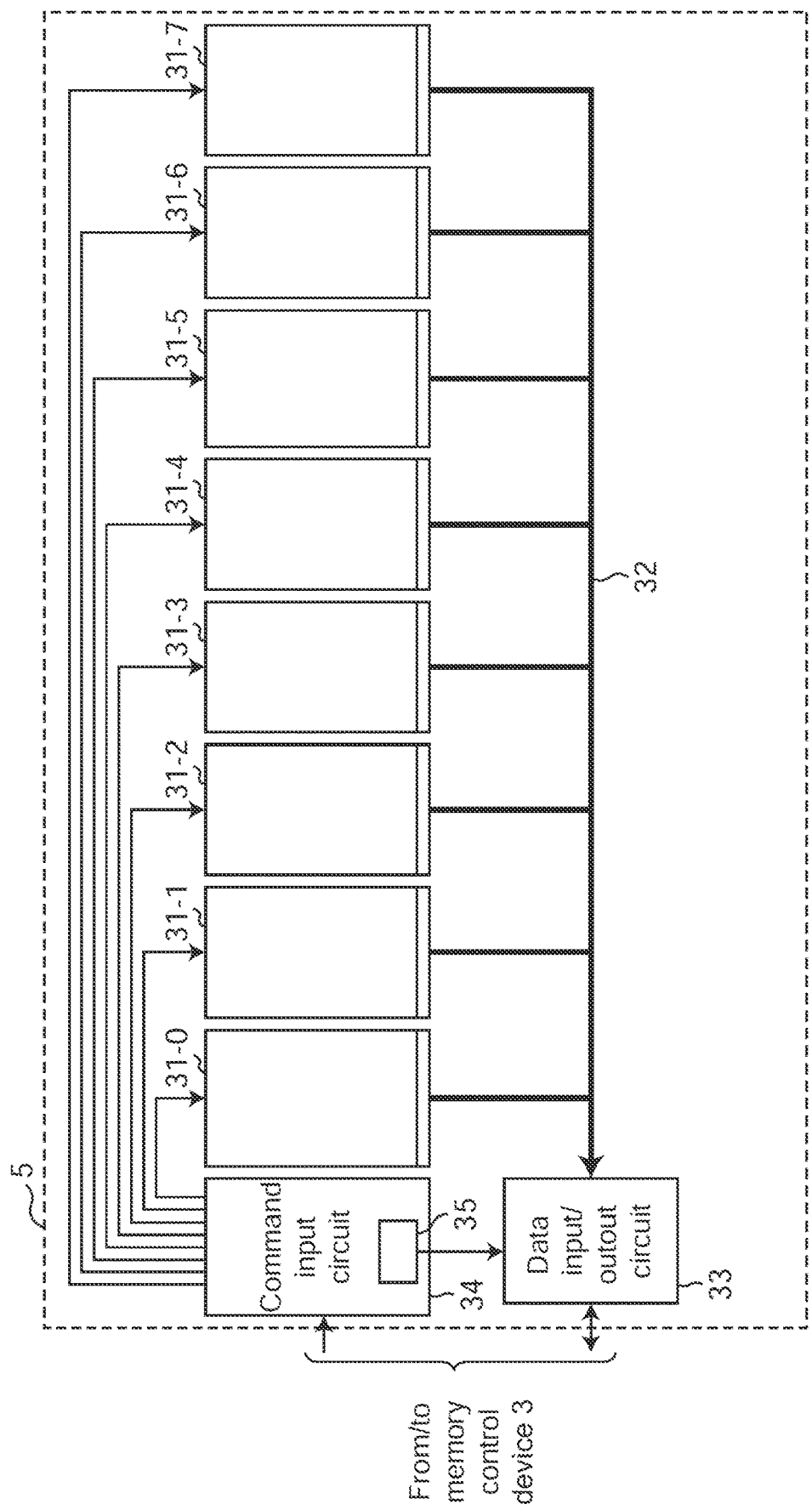
FIG. 3: A block diagram showing a configuration of a memory 5 of FIG. 1.

FIG. 3 is a block diagram showing the configuration of the memory 5 of FIG. 1. The memory 5 includes banks 31-0 to 31-7, an internal data bus 32, a data input/output circuit 33, a command input circuit 34, and a multipurpose register (MPR) 35. Banks 31-0 to 31-7 are connected to one another by the internal data bus 32. In this specification, the banks 31-0 to 31-7 are collectively referred to as "banks 31". A data input/output circuit 33 is connected to the memory control device 3 via the data bus of the memory bus 4, is connected to the plurality of banks 31 via the internal data bus 32, and is connected between the memory control device 3, and data is transmitted and received between the memory control device 3 and the plurality of banks 31. A command input circuit 34 is connected to the memory control device 3 via a command bus of the memory bus 4, and receives commands for controlling the plurality of banks 31 from the memory control device 3. The MPR 35 is a register conforming to the JEDEC standard, which can be read from the memory control device 3 via the data bus of the memory bus 4.

Figure 4:
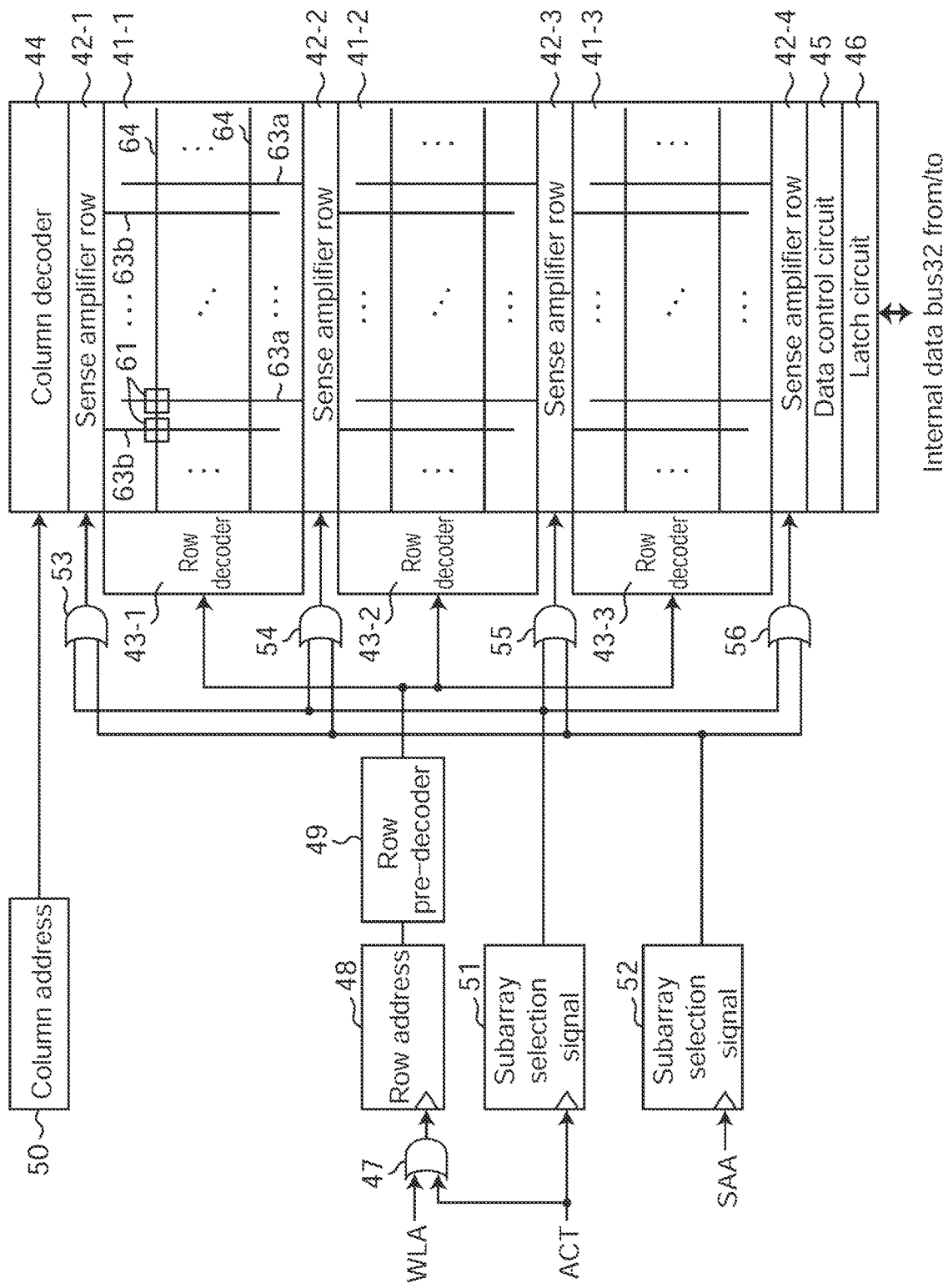
FIG. 4: A schematic diagram showing a configuration of one of the banks 31-0 to 31-7 in FIG. 3.

FIG. 4 is a schematic diagram showing a configuration of one of the banks 31-0 to 31-7 of FIG. 3.

A bank of FIG. 4 includes subarrays 41-1 to 41-3 separated from one another by sense amplifier rows 42-1 to 42-4. In this specification, the subarrays 41-1 to 41-3 are collectively referred to as "subarrays 41", and sense amplifier arrays 42-1 to 42-4 are collectively referred to as "sense amplifier arrays 42".

Figure 5:
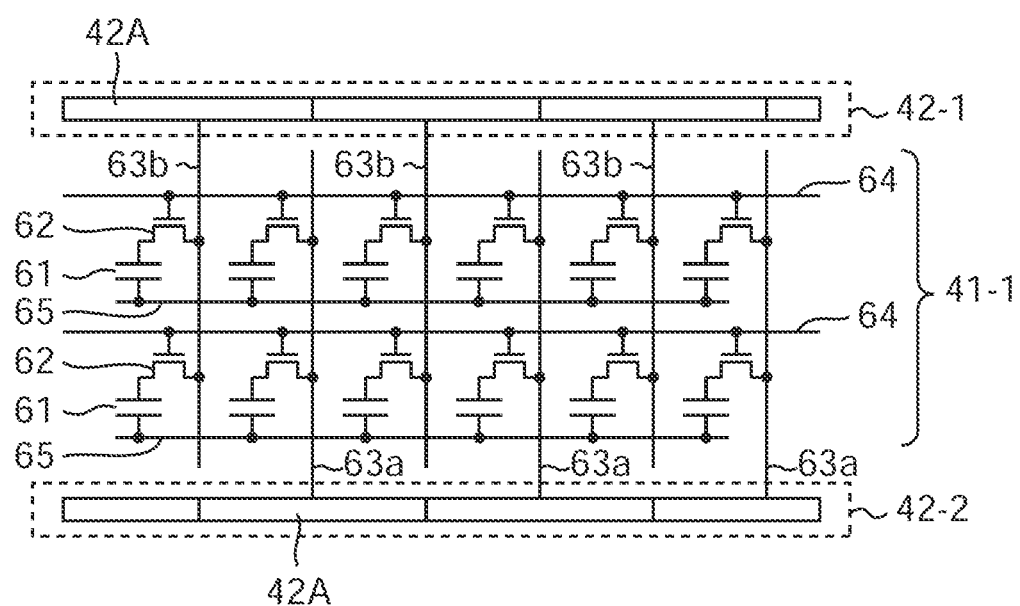
FIG. 5: A circuit diagram showing a configuration of a subarray 41-1 of FIG. 4.

FIG. 5 is a circuit diagram showing a configuration of the subarray 41-1 of FIG. 4. The subarray 41-1 includes a plurality of memory cells 61 arranged along bit lines including a plurality of bit lines 63a and a plurality of bit lines 63b, and a plurality of word lines 64 orthogonal to one another. Each of a sense amplifier row 42-1 and a sense amplifier row 42-2 include a plurality of sense amplifiers 42A. Each of the memory cells 61 is capacitive elements for storing a charge. One end of each of the memory cells 61 is connected to a cell plate 65, and other end of each of the memory cells 61 is connected to bit line 63a or bit line 63b via switching elements 62. The cell plate 65 is connected to a voltage source at a cell plate potential which is a ground potential or another potential. Each bit lines 63a is connected to one of a plurality of the sense amplifiers 42A of the sense amplifier row 42-2, and each bit lines 63b is connected to one of the plurality of sense amplifiers 42A of sense amplifier row 42-1. Each of the switching elements 62 is, for example, a transistor. Each of the switching elements 62 connects or disconnects each of the memory cells 61 arranged along each of the word lines 64 to each of the bit line 63a or each of the bit line 63b according to the active or inactive state of the word lines 64. In other words, each of the switching elements 62 selects a plurality of memory cells 61 arranged along a single word line 64.

The memory cell 61 is an example of memory cell of a semiconductor memory device.

The other subarrays 41-2 and 41-3 are also configured similarly to the subarray 41-1 of FIG. 5.

The bank of the FIG. 4 further includes, as its peripheral circuits, row decoders 43-1 to 43-3, a column decoder 44, a data control circuit 45, a latch circuit 46, OR-operation circuits 47 and 53 to 56, a row address register 48, a row pre-decoder 49, a column address register 50, a subarray selection signal register 51, and a subarray selection signal register 52. A row pre-decoder 49 and row decoders 43-1 to 43-3 decode a row address of each of the subarrays 41-1 to 41-3 stored in the row address register 48, and activate word lines. A column decoder 44 decodes a column address stored in a column address register 50, and selects one of the sense amplifiers 42A of each of the sense amplifier rows 42 via a plurality of column selection lines, not shown in the FIG. 5. A data control circuit 45 temporarily stores data read from the sense amplifiers 42A selected by a column selection line in a latch circuit 46 via an input/output line, not shown in the FIG. 5. The data control circuit 45 also writes data stored in the latch circuit 46 to the sense amplifiers 42A selected by a column selection line via the input/output line. Subarray selection signal registers 51 and 52 store signals for selecting one of the subarrays 41-1 to 41-3. The data control circuit 45 may include, for example, a circuit such as an amplifier that amplifies data read from the sense amplifiers 42A and the latch circuit 46.

Next, a method of transmitting subarray information of the memory 5 from the memory 5 to the memory control device 3 will be described.

The subarray information indicates the range of row addresses included in each of the subarrays 41 in each bank 31. The subarray information includes a number of row addresses included in one cycle of one or more subarrays 41 periodically arranged in one bank 31 and a number of row addresses from a beginning of a cycle to a beginning of each subarray 41 included in the cycle. In other words, the subarray information indicates from which row address to which row address the memory cells 61 share same bit lines 63a and same bit lines 63b and same sense amplifiers 42A. Such memory cells 61 and word lines 64 are referred to as "belonging to a same subarray".

A transfer control circuit 12 of the memory control device 3 receives the subarray information from the memory 5 via at least one signal line of the data bus of the memory bus 4. The subarray information is stored, for example, in the MPR 35 of the memory 5. In this case, the transfer control circuit 12 receives subarray information from the MPR 35 of the memory 5 using a mode register read command according to the JEDEC standard. In a case of DDR3-SDRAM, when transmitting a JEDEC standard mode register set (MRS) command from the memory control device 3 to the memory 5, by setting a 3-bit bank address BA [2:0]=LHH and a bit A [2]=H of an address, the MRS command becomes a mode register read command for reading out the data stored in the MPR 35 of the memory 5 to the memory control device 3 via the data bus of the memory bus 4. Here, "H" indicates a high level bit value, and "L" indicates a low level bit value. In the current JEDEC standard, a bit value A [1:0]=HH of an address is reserved, but using it, as described below with reference to FIG. 6 or FIG. 7, a data stored in the MPR 35 is outputted.

It will be described according to two subarray division cases referring to FIG. 6, FIG. 7A and FIG. 7B wherein each of the banks 31 of 1 Gb DDR3-SDRAM having eight banks 31 is divided into (1) eight subarrays and (2) twelve subarrays.

In examples of FIG. 6 and FIG. 7, it is assumed that in one bank 31, 8192 word lines represented by a 13-bit row address A [12:0] exist. Further, in the examples of FIG. 6 and FIG. 7, a data bus of the memory bus 4 includes 16-bit data lines DQ [15:0].

Of the data output over eight bursts via the 16-bit data lines DQ [15:0], a leading burst "0" indicates a number of row addresses included in one period of one or more subarrays periodically arranged in one bank 31. Second and subsequent bursts "1", "2", . . . indicate a number of row addresses from a beginning of a cycle to a beginning of each of subarrays included in the cycle.

FIG. 6 is a table showing a first example of subarray information transmitted from the memory 5 of FIG. 1 to the memory control device 3. When one bank 31 including 8192 word lines is divided into eight subarrays, each divided subarray includes a same number of row addresses. When one bank 31 including 8192 word lines is divided into eight subarrays, each of the divided subarrays includes a same number of row addresses, and a number of row addresses included in one cycle of periodically arranged subarrays is equal to the number of row addresses included in one subarray. The number of row addresses included in the cycle of the subarray is 0x0400 (1024 in decimal) in hexadecimal notation. Therefore, as shown in FIG. 6, the first burst output via the 16-bit data lines DQ [15:0] is 0x0400. Since the second burst indicates a number of row addresses from a beginning of a cycle to a beginning of each of the subarrays included in the cycle, it is naturally 0x0000 (0 in decimal) in hexadecimal notation. Third and subsequent bursts are all 0x0000 in hexadecimal notation. Similarly, when one bank 31 including 8192 word lines is divided into an integer power of 2 subarrays, only the first burst has a nonzero value, and the second and subsequent bursts have zero values.

FIG. 7 is a table showing a second example of a subarray information transmitted from the memory 5 of FIG. 1 to the memory control device 3. Dividing one bank 31 including 8192 word lines into 12 subarrays is slightly more complicated than dividing it into eight subarrays. 2048 word lines obtained by equally dividing 8192 word lines into four subarrays are further divided into 688+672+688 each. A number of row addresses included in a cycle of the subarray is 0x0800 (2048 in decimal) in hexadecimal notation. Therefore, as shown in FIG. 7, a leading burst is 0x0800. A second burst indicates 0x0000 (0 in decimal) because it indicates a number of row addresses from a beginning of the cycle to a beginning of a first subarray included in the cycle. Since a third burst indicates a number of row addresses from the beginning of the cycle to a beginning of a second subarray included in the cycle, 0x02B0 (decimal number 688) is obtained for the third burst. Since a fourth burst indicates a number of row addresses from the beginning of the cycle to a beginning of a third subarray included in the cycle, the fourth burst is 0x0550 (1360 in decimal). Since "2048" is added to a number of row addresses from a top of the bank 31 to a top of a fourth subarray and the subsequent subarrays, the fifth and subsequent bursts are all 0x0000.

Thus, the memory 5 can transmit a subarray information to the memory control device 3 using the MPR 35. The transfer control circuit 12 of the memory control device 3 stores the subarray information in the subarray information register 24 when the subarray information is received from the memory 5.

Next, the data transfer in the memory 5 of the memory system according to the first embodiment will be described.

When instructed by processor 1 to transfer data inside memory 5, the transfer control circuit 12 of the memory control device 3 transmits a JEDEC-standard first signal value, not in use to the memory 5, via at least one signal line of the command bus of the memory bus 4. The command input circuit 34 of the memory 5 receives the first signal value from the memory control device 3. Thereby, the transfer control circuit 12 and the command input circuit 34 enable an additional transfer command not defined in the JEDEC standard. The additional transfer command is for writing the data read from the memory cells 61 of the transfer source of the memory 5 into the memory cells 61 of a transfer destination of the memory 5 without passing through the outside of the memory 5.

A transfer command includes: Word Line Assertion (WLA) command to activate one-word line 64 without activating sense amplifiers 42A, and sense amplifier activation command, Sense-Amplifier Activation: SAA, for activating the sense amplifiers 42A of one subarray 41 without activating the word line 64. The transfer command further includes a transfer read command and a transfer write command for writing the data read from the memory cells 61 of the transfer source subarray 41 into the memory cells 61 of a transfer destination subarray 41 without passing outside the memory 5.

When the transfer control circuit 12 of the memory control device 3 transmits the MRS command of the JEDEC standard to the memory 5, a first signal value is transmitted to the memory 5 via the signal line of the bank address BA [2:0] of the command bus of the memory bus 4. The first signal value is set to, for example, a bank address BA [2:0]=HHH of the MRS command which is not used in the JEDEC standard. When sending the MRS command to memory 5, the transfer control circuit 12 further transmits an address bit A12=H to the memory 5. When the transfer control circuit 12 transmits the MRS command to the memory 5 together with a bank address BA [2:0]=HHH and an address bit A12=H, the memory control device 3 and the memory 5 transition from the normal mode to the transfer mode.

When the memory control device 3 and the memory 5 transition to the transfer mode, the transfer control circuit 12 and the command input circuit 34 set the transfer command to available as follows.

The transfer control circuit 12 and the command input circuit 34 invalidate the JEDEC standard ZQ calibration command, and set the bit value assigned to the ZQ calibration command to be usable as the bit value of WLA command.

Furthermore, when transmitting the MRS command of the JEDEC standard to the memory 5, the transfer control circuit 12 of the memory control device 3 transmits a second signal value to the memory 5 via the bank address signal line of the command bus of the memory bus 4. The command input circuit 34 of the memory 5 receives the second signal value from the memory control device 3. The second signal value is set to, for example, a bank address BA [2:0]=HHL of the MRS command which is not used in the JEDEC standard. The transfer control circuit 12 transmits the MRS command to the memory 5 together with the bank address BA [2:0]=HHL and an address of the sense amplifiers 42A of a certain subarray 41. Thereby, the transfer control circuit 12 and the command input circuit 34 set a bit value assigned to the MRS command to be usable as a bit value of the SAA command.

Furthermore, the transfer control circuit 12 and the command input circuit 34 invalidate a burst chops and an auto pre-charge of the JEDEC standard read/write commands. Furthermore, when transmitting a read command and a write command of the JEDEC standard to the memory 5, the transfer control circuit 12 of the memory control device 3 transmits a third signal value to the memory 5 via at least one of the signal lines of address buses, column address buses, of the memory bus 4. The command input circuit 34 of the memory 5 receives the third signal value from the memory control device 3. Thereby, the transfer control circuit 12 and the command input circuit 34 set bit values assigned to the read command and the write command according to the JEDEC standard to be usable as bit values of the transfer read command and the transfer write command, respectively. The third signal value is represented, for example, by upper bits A [12:10] of the column address of the read command and the write command. These bits A [12:10] are used as an identification code, or address key, to indicate that functions of the transfer read command and the transfer write command are different from those of the normal DDR3-SDRAM, described later.

The transfer control circuit 12 and the command input circuit 34 transfer data inside the memory 5 in accordance with the WLA command, the SAA command, the transfer read command, and the transfer write command.

When the data transfer is completed, the transfer control circuit 12 of the memory control device 3 transmits the MRS command, a bank address BA [2:0]=HHH, and an address bit A12=L to the memory 5. Thereby, the memory control device 3 and the memory 5 return from the transfer mode to the normal mode.

Here, the operation of the memory 5 when using the WLA command and the SAA command will be described with reference to FIG. 4 again.

The WLA command is inputted to the bank of FIG. 4 together with a row address. When the WLA command is input to the bank of FIG. 4, a word line 64 corresponding to the row address input simultaneously with the WLA command is activated. At this time, operations related to the selection of the subarrays 41, such as equalizing the sense amplifiers 42A and the bit lines 63a and 63b, are not performed. Therefore, the WLA command is used when writing data already amplified by the sense amplifiers 42A into memory cells 61 connected to the word line 64 of a transfer destination.

Of the addresses inputted with the SAA command, that is, the MRS command and the bank address BA [2:0]=HHL, the lower bits A [2:0] represent the address of a bank 31 including a subarray 41 to be activated, and a predetermined number of bits from a most significant bit of the address represent an address required to select a subarray. Sense amplifiers 42A of the subarrays 41 designated by the address input together with the SAA command is activated. However, in this operation, the sense amplifiers 42A are not connected to the input/output line passing through the bank 31. When the SAA command is input to the bank of FIG. 4, the word line 64 is not activated. Therefore, according to the SAA command, when transferring data between different subarrays of one bank, the data is stored in advance in the sense amplifiers 42A, and the WLA command is finally issued to store the data in the memory cells 61 of a transfer destination.

Figure 8:
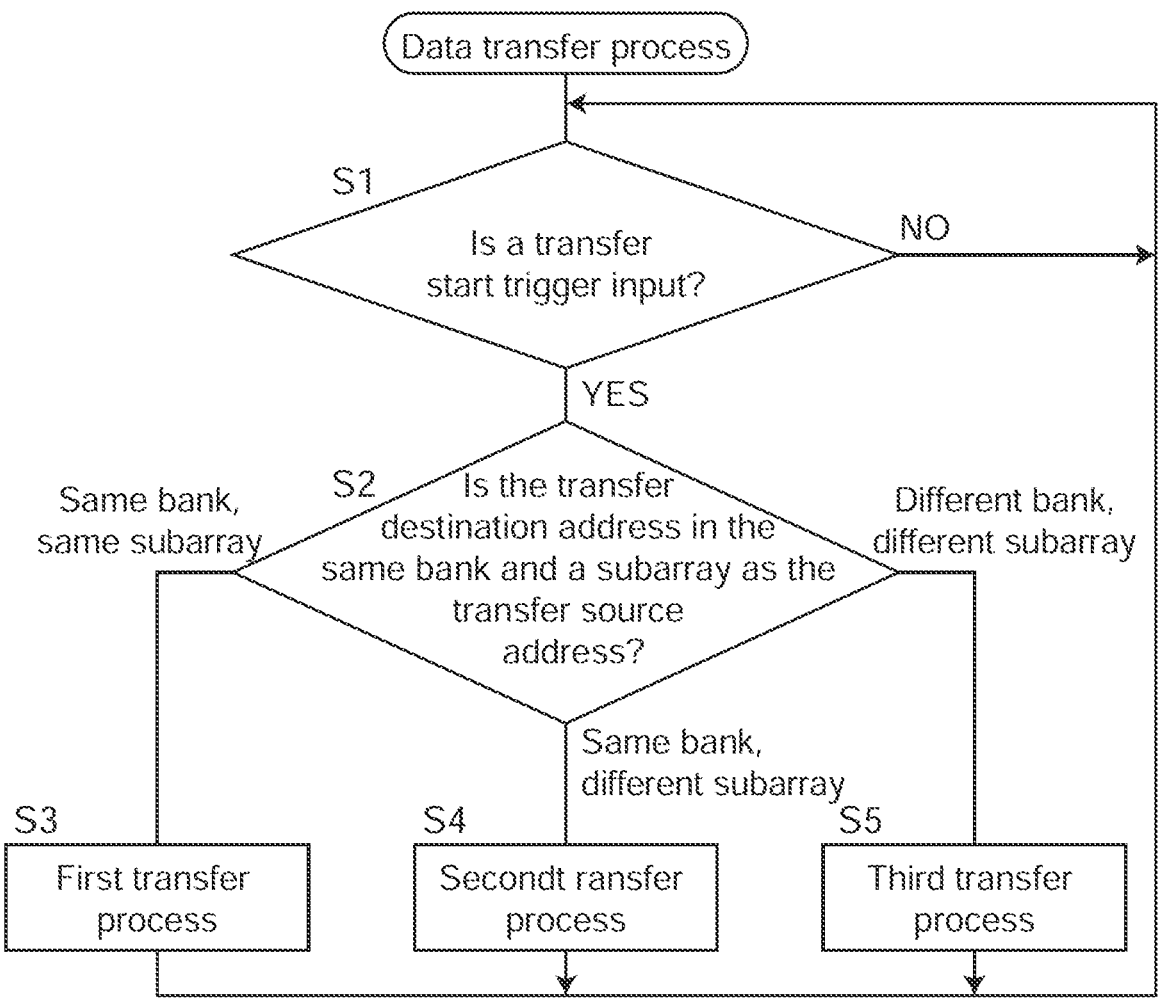
FIG. 8: A flowchart showing data transfer processing performed by the transfer control circuit 12 of FIG. 2.

FIG. 8 is a flow chart showing the data transfer process executed by a transfer control circuit 12 in FIG. 2.

In a step S1 of FIG. 8, the transfer control circuit 12 judges whether or not the transfer start trigger has been inputted from the processor 1 to the transfer start trigger register 26; when the judgement is YES, the process proceeds to a step S2; when the judgement is NO, the step S1 is repeated. In the step S2, the transfer control circuit 12 judges whether a transfer destination address is in the same bank and in the same subarray as the transfer source address; when they are in the same bank and in the same subarray, the process proceeds to a step S3; when they are in the same bank and different subarrays, the process proceeds to a step S4; when they are in different banks and different subarrays, the process proceeds to a step S5. In the step S3, the transfer control circuit 12 executes a first transfer process. In the step S4, the transfer control circuit 12 executes a second transfer process. In the step S5, the transfer control circuit 12 executes a third transfer process.

Figure 9:
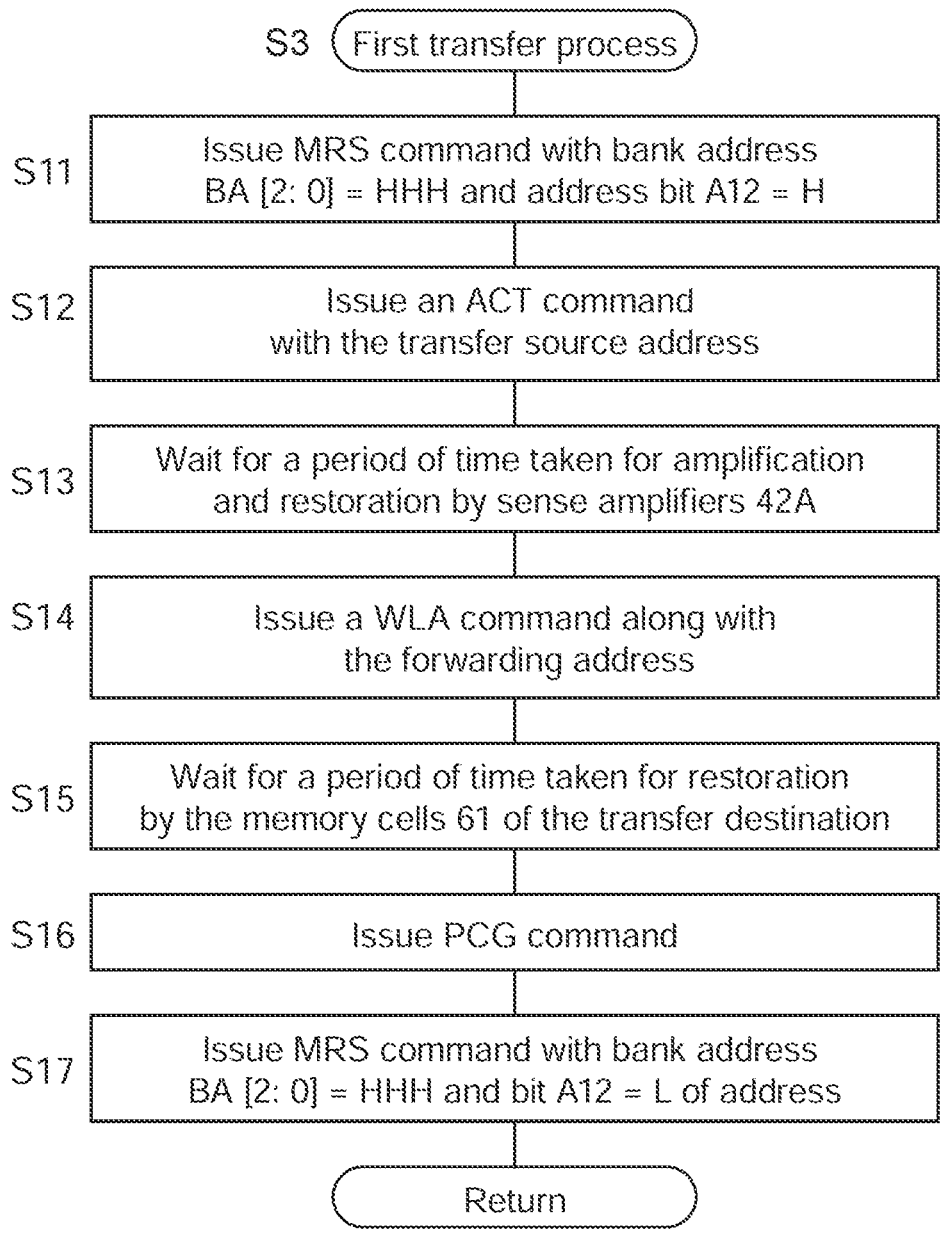
FIG. 9: A subroutine showing a first transfer process of FIG. 8.

FIG. 9 is a subroutine showing a first transfer process of FIG. 8. The first transfer process is a process when transferring data inside one subarray 41 in one bank 31.

In a step S11 of FIG. 9, the transfer control circuit 12 transmits the MRS command, a bank address BA [2:0] HHH, and an address bit A2=H to the memory 5. Thereby, the memory control device 3 and the memory 5 transition from the normal mode to the transfer mode. In a step S12, the transfer control circuit 12 transmits to memory 5 one-word line 64, an activation command ACT of the JEDEC standard for activating sense amplifiers 42A of the subarray 41 and a row address of a word line 64 including memory cells 61 of a transfer source. In a step S13, the transfer control circuit 12 stands by for a time period required for amplification and restoration by the sense amplifiers 42A. In a step S14, the transfer control circuit 12 transmits the WLA command and a row address of the word line 64 including the memory cells 61 of a transfer destination to the memory 5. At this time, the word line 64 asserted by the ACT command is automatically negated, and the data read from the transfer source memory cells 61 is amplified and held in the sense amplifiers 42A. The data held in the sense amplifiers 42A is stored in the memory cells 61 connected to the word line 64 activated by the WLA command. In a step S15, the transfer control circuit 12 stands by for a time period required for restoration by the memory cells 61 of the transfer destination. In a step S16, the transfer control circuit 12 issues a Pre-charge or PCG command of JEDEC standard, thereby completing the data transfer. Thereafter, the transfer control circuit 12 transmits the MRS command, a bank address BA [2:0]=HHH, and an address bit A12=L to the memory 5. Thereby, the memory control device 3 and the memory 5 return from the transfer mode to the normal mode.

Figure 10:
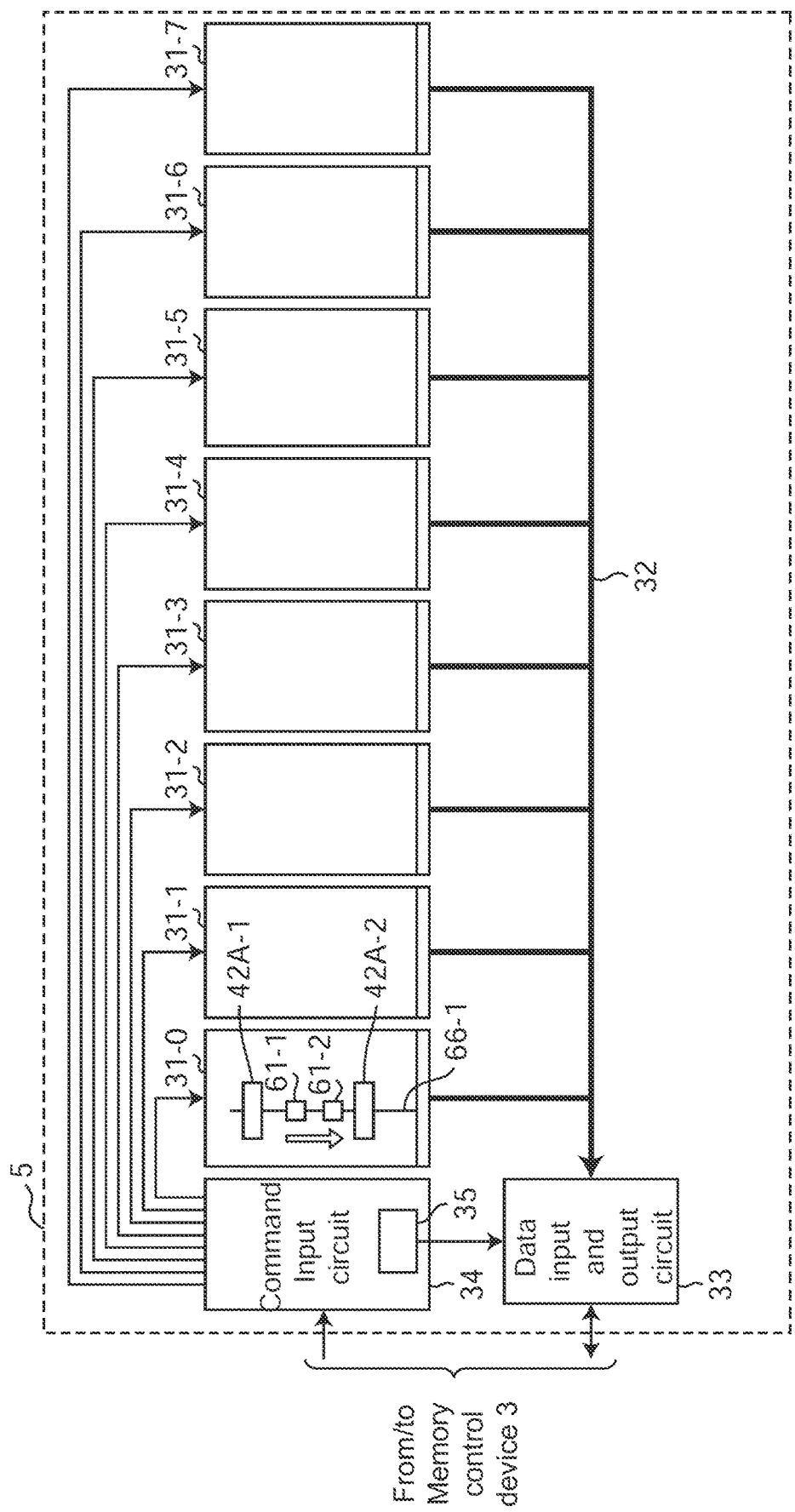
FIG. 10: A schematic view showing an operation of the memory 5 when the first transfer process of FIG. 8 is performed.

FIG. 10 is a schematic diagram showing the operation of the memory 5 when the first transfer process of FIG. 8 is performed. The bank 31-0 includes a memory cell 61-1, a memory cell 61-2, a sense amplifier 42A-1 and a sense amplifier 42A-2 included in a same subarray, and an input/output line 66-1 of the bank 31-0. Data is transferred from a transfer source memory cell 61-1 to the transfer destination memory cells 61-2 without passing through the internal data bus 32.

Figure 11:
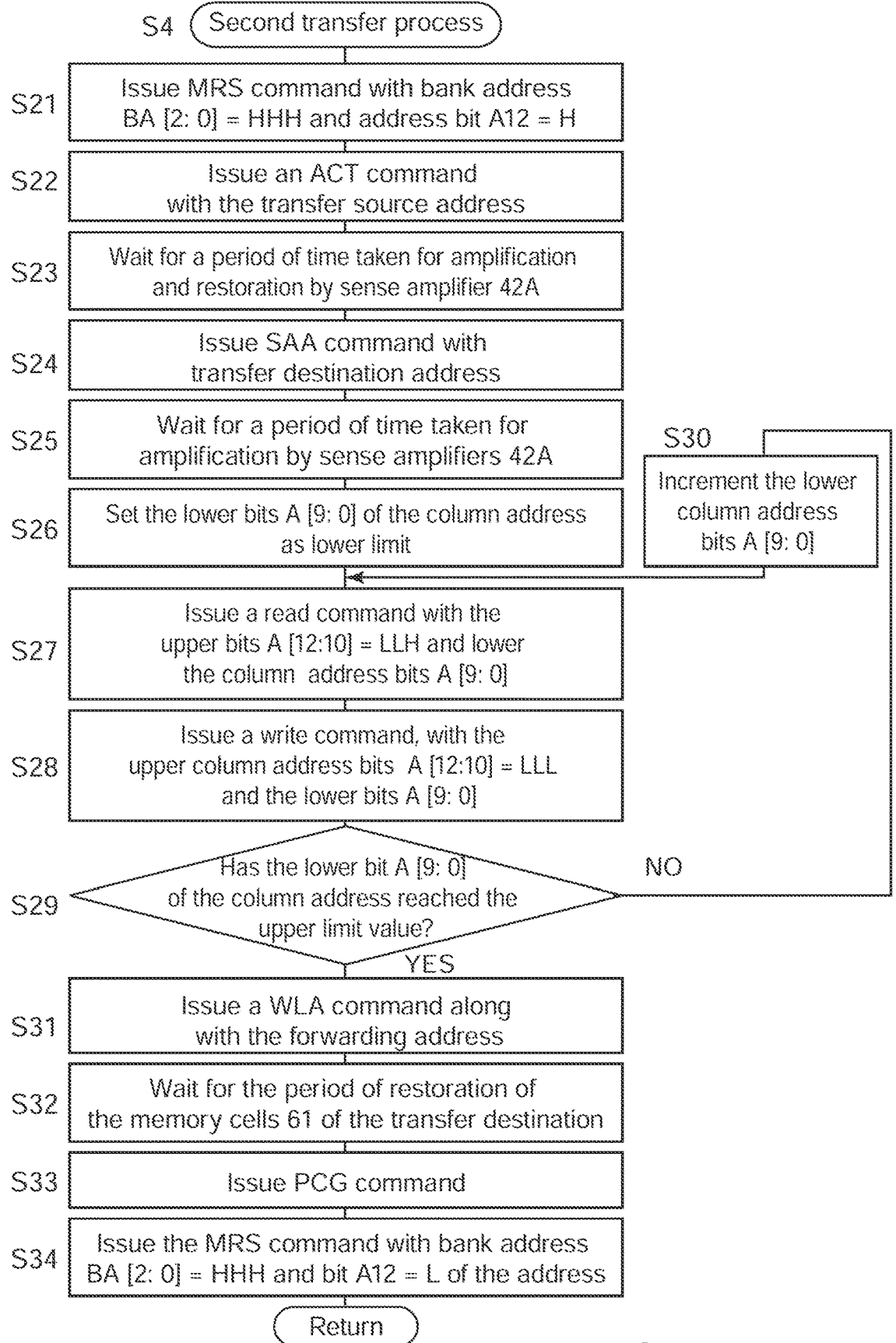
FIG. 11: A subroutine showing a second transfer process of FIG. 8.

FIG. 11 is a subroutine showing the second transfer process of FIG. 8. The second transfer process is a process when data is transferred between different subarrays 41 in one bank 31.

In a step S21 of FIG. 11, the transfer control circuit 12 transmits the MRS command, a bank address BA [2:0] =HHH, and an address bit A12=H to the memory 5. Thereby, the memory control device 3 and the memory 5 transition from the normal mode to the transfer mode.

In a step S22, the transfer control circuit 12 transmits to the memory 5 the ACT command of the JEDEC standard and a row address of the word line 64 including the memory cells 61 of the transfer source. In a step S23, the transfer control circuit 12 stands by for a time period required for amplification and restoration by the sense amplifiers 42A. In a step S24, the transfer control circuit 12 transmits the SAA command and an address of sense amplifiers 42A of a subarray 41 including a word line 64 including memory cells 61 of a transfer destination to the memory 5. The sense amplifiers 42A of the subarray 41 including a word line 64 including memory cells 61 of a transfer destination is activated by the SAA command. In a step S25, the transfer control circuit 12 stands by for a time period required for amplification by the sense amplifiers 42A.

In a conventional DDR3-SDRAM row decoder configuration, it is very difficult to independently assert a plurality of word lines in one bank. Therefore, in the embodiment, data is stored in memory cells 61 by subsequently asserting a word line 64 including the memory cells 61 of a transfer destination using the WLA command.

In a step S26, the transfer control circuit 12 sets lower column address bits A [9:0] to the lower limit value. In a step S27, the transfer control circuit 12 transmits a read command according to the JEDEC standard, upper column address bits A [12:10]=LLH, and the lower column address bits A [9:0] to the memory 5. In a step S28, the transfer control circuit 12 transmits a write command according to the JEDEC standard, upper column address bits A [12:10]=LLL, and the lower column address bits A [9:0] to the memory 5. In a step S27 and a step S28, a read command and a write command of the JEDEC standard are respectively used as a transfer read command and a transfer write command as described above. In a step S29, transfer control circuit 12 determines whether the lower column address bit A [9:0] has reached an upper limit value, and proceeds to a step S31 if YES, and proceeds to a step S30 if NO. In the step S30, the transfer control circuit 12 increments the lower column address bits A [9:0]. After that, the transfer control circuit 12 repeats reading and writing to the same column address while incrementing the column address.

After accessing the addresses corresponding to all column selection lines, the transfer control circuit 12 transmits the WLA command and a row address of a word line 64 including memory cells 61 of a transfer destination to the memory 5 in the step S31. In a step S32, the transfer control circuit 12 stands by for a time period required for restoration by memory cells 61 of a transfer destination. In a step S33, the transfer control circuit 12 issues the PCG command of the JEDEC standard, whereby a data transfer is completed. Thereafter, the transfer control circuit 12 transmits the MRS command, a bank address BA [2:0]=HHH, and an address bit A12=L to the memory 5. Thereby, the memory control device 3 and the memory 5 return from the transfer mode to the normal mode.

However, the operation of the memory 5 when the read command and the write commands, i.e. the transfer read command and the transfer write command, are received in the second transfer process, is a different operation from conventional DDR-SDRAM's normal operation.

Figure 12:
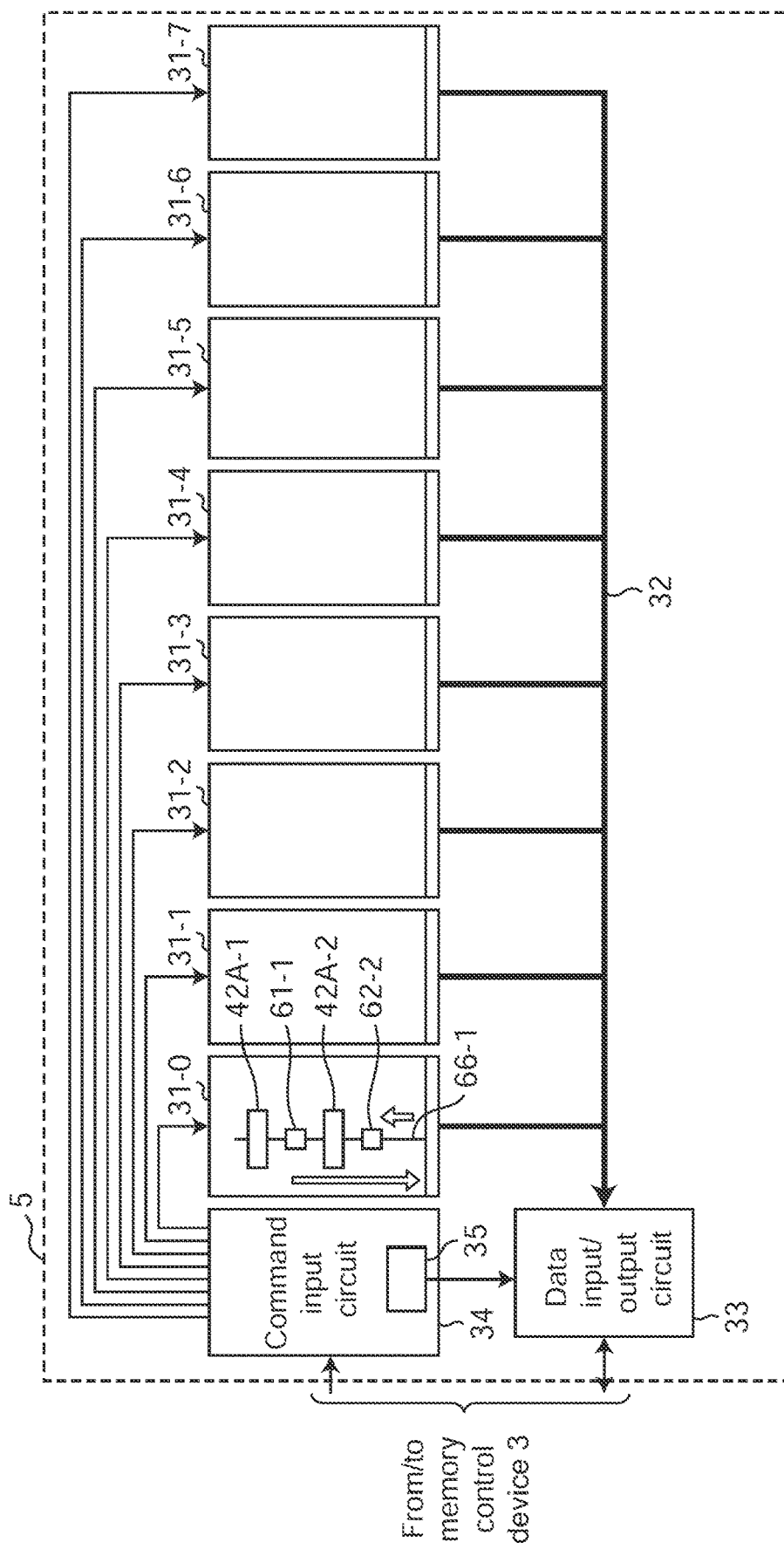
FIG. 12: A schematic view showing an operation of the memory 5 when the second transfer process of FIG. 8 is performed.

FIG. 12 is a schematic diagram showing an operation of the memory 5 when the second transfer process of FIG. 8 is performed. A bank 31-0 includes a memory cell 61-1, a memory cell 61-2, a sense amplifier 42A-1 and a sense amplifier 42A-2 included in different subarrays, and an input/output line 66-1 of the bank 31-0. The read command used in the second transfer process uses upper address bits A [12:10]=LLH as an address key to distinguish it from a normal read operation. These three bits are HLL during the normal operation. When this read command is inputted, data read from the memory cells 61 at a transfer source are passed to the data control circuit 45 via a pair of input/output lines 66-1 passing through the bank, and the internal data bus 32 Are stored in the latch circuit 46 from the data control circuit 45 without passing through. This is aimed at low power consumption and low latency. Next, the write command used in the second transfer process uses an address [12:10]=LLL as an address key to distinguish it from a normal write operation. These three bits are also HLL in normal operation. When this write command is inputted, the data control circuit 45 transfers the data stored in the latch circuit 46 at the time of the read operation described above to the pair of input/output lines 66-1 in the bank 31-0 without fetching data from the internal data bus 32 into the latch circuit 46. Further, in response to the write command, the pair of input/output lines 66-1 are electrically connected to the column selection transistors of the sense amplifiers 42A activated by the SAA command. The data outputted to the pair of input/output lines 66-1 by the data control circuit 45 is written to the activated sense amplifiers 42A. These reading and writing are repeated, and data is transferred between different subarrays 41 in one bank 31-0.

Figure 13:
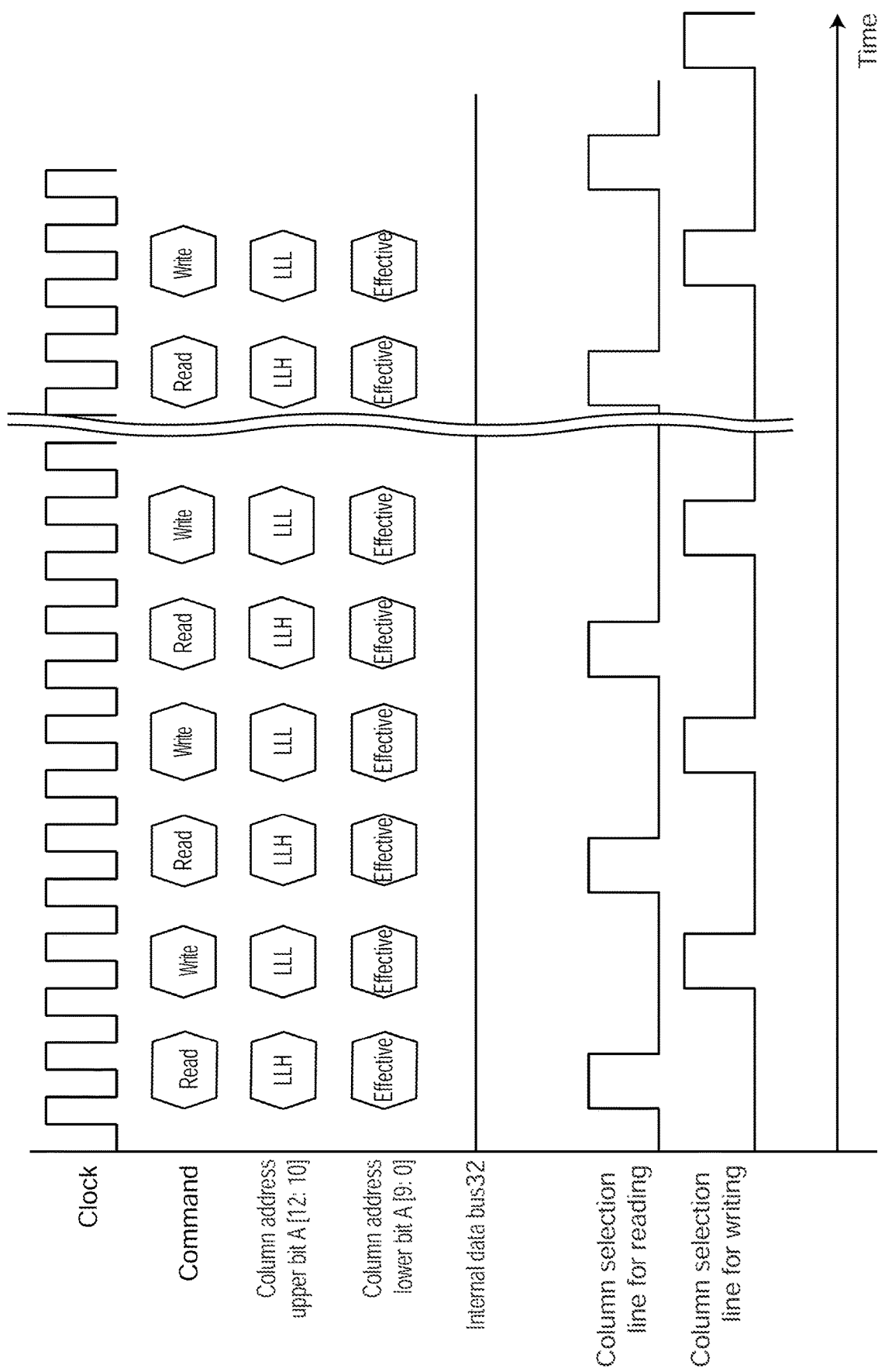
FIG. 13: A timing chart showing an operation of the memory 5 when the second transfer process of FIG. 8 is performed.

FIG. 13 is a timing chart showing an operation of the memory 5 when the second transfer process of FIG. 8 is performed. FIG. 13 shows a read command and a write command sequence when transferring data between different subarrays 41 in one bank 31. Since it is not necessary to output data to the outside of the memory 5 and to input data from the outside of the memory 5, neither a read operation nor a write operation requires a large latency cycle. For this reason, the interval between the read command and the write command can be shortened within an allowable range with respect to the timing of the internal operation of the memory 5.

Figure 14:
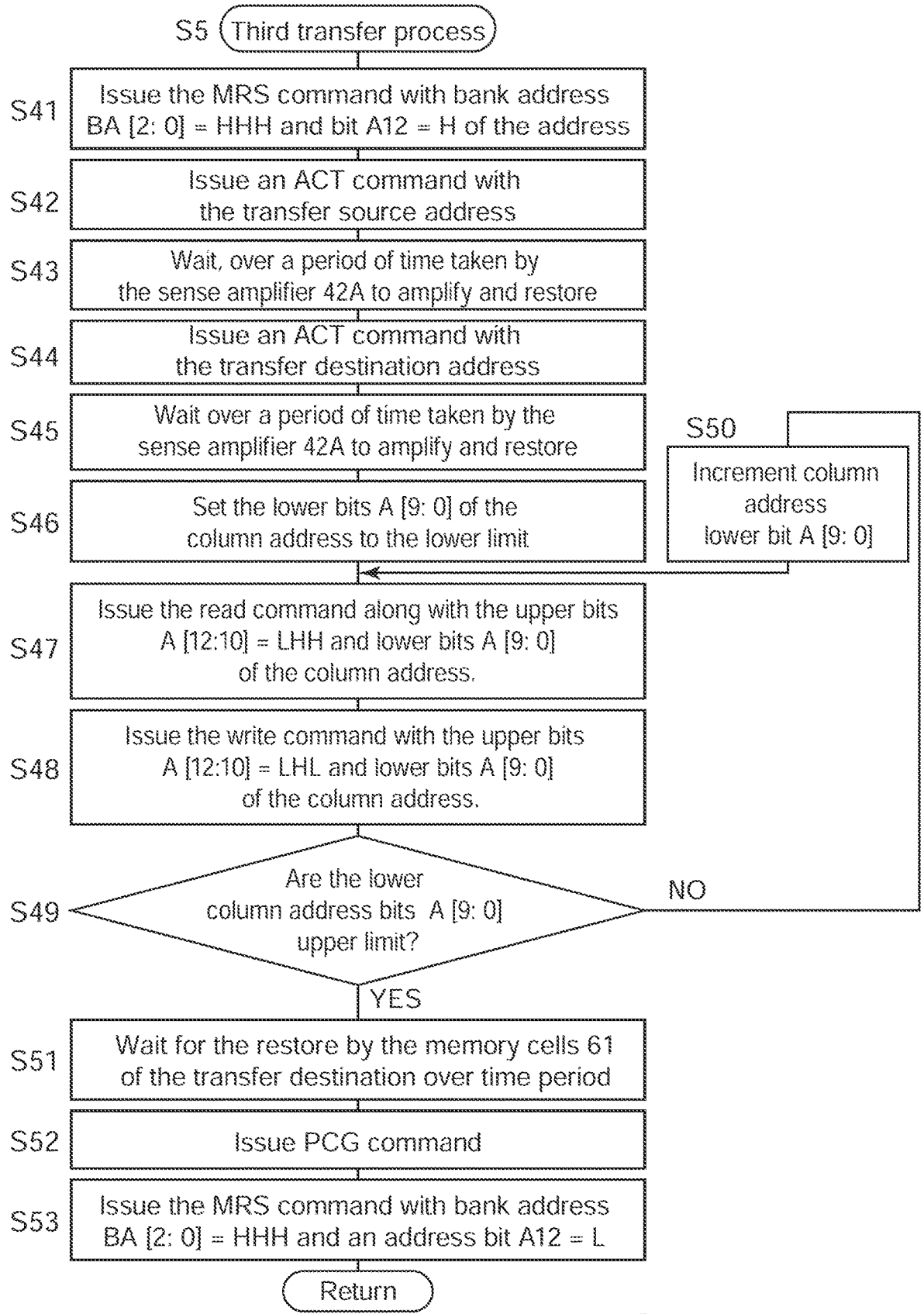
FIG. 14: A subroutine showing a third transfer process of FIG. 8.

FIG. 14 is a subroutine showing the third transfer process of FIG. 8. The third transfer process is a process when data is transferred between mutually different subarrays 41 in different ones of the plurality of banks 31.

In a step S41 of FIG. 14, the transfer control circuit 12 transmits the MRS command, a bank address BA [2:0]=HHH, and an address bit A12=H to the memory 5. Thereby, the memory control device 3 and the memory 5 transition from the normal mode to the transfer mode.

In a step S42, the transfer control circuit 12 transmits, to the memory 5, the ACT command of the JEDEC standard and a row address of the word line 64 including the memory cells 61 of a transfer source. In a step S43, the transfer control circuit 12 stands by for a time period required for amplification and restoration by the sense amplifiers 42A. In a step S44, the transfer control circuit 12 transmits, to the memory 5, and the ACT command of the JEDEC standard and a row address of the word line 64 including the memory cell 61 of a transfer destination. In a step S45, the transfer control circuit 12 stands by for a time period required for amplification and restoration by the sense amplifiers 42A.

In a step S46, the transfer control circuit 12 sets the lower column address bits A [9:0] to the lower limit value. In a step S47, the transfer control circuit 12 transmits a read command according to the JEDEC standard, upper column address bits A [12:10]=LHH, and lower column address bits A [9:0] to the memory 5. In a step S48, the transfer control circuit 12 transmits a write command according to the JEDEC standard, upper column address bits A [12:10]=LHL, and the lower column address bits A [9:0] to the memory 5. In a steps S47 and S48, a JEDEC standard read command and a JEDEC standard write command are respectively used as a transfer read command and as a transfer write command as described above. In a step S49, the transfer control circuit 12 determines whether the lower column address bits A [9:0] reached the upper limit value, and proceeds to a step S51 if YES, and proceeds to a step S50 if NO. move on. In the step S50, the transfer control circuit 12 increments the lower column address bits A [9:0]. Thereafter, the transfer control circuit 12 repeats reading and writing for the same column address while incrementing the column address A [9:0].

After accessing addresses corresponding to all column selection lines, in a step S51, the transfer control circuit 12 waits for a time period required for restoration by the memory cells 61 of a transfer destination. In a step S52, the transfer control circuit 12 issues the PCG command of the JEDEC standard, thereby completing a data transfer. Thereafter, the transfer control circuit 12 transmits the MRS command, a bank address BA [2: 0]=HHH, and an address bit A12=L to the memory 5. Thereby, the memory control device 3 and the memory 5 return from the transfer mode to the normal mode.

However, when "a read command and a write command", that is, "a transfer read command and a transfer write command", are received in the third transfer process, this operation of the memory 5 is different from a normal operation of conventional DDR-SDRAM.

Figure 15:
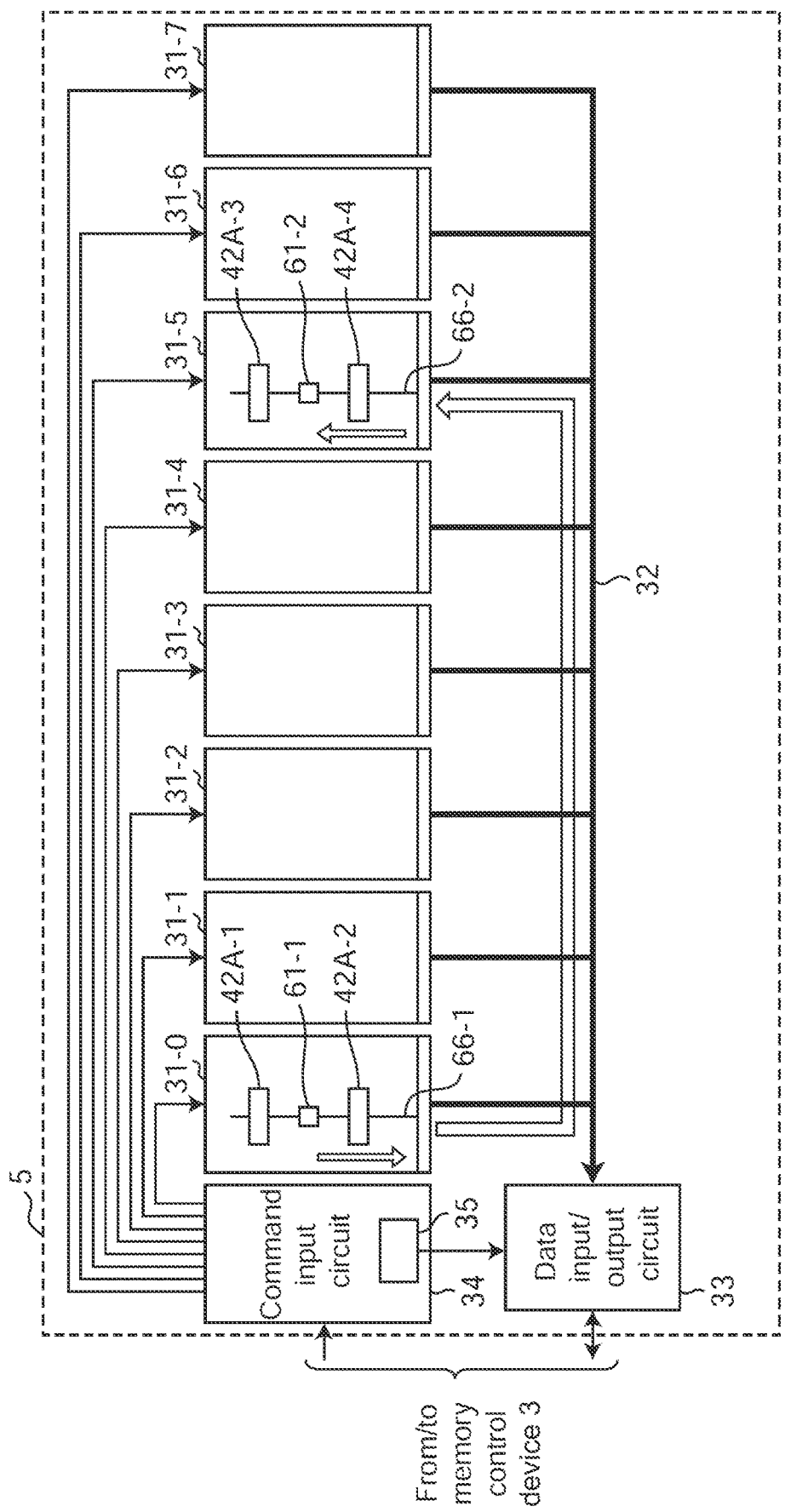
FIG. 15: A schematic view showing an operation of the memory 5 when the third transfer process of FIG. 8 is performed.

FIG. 15 is a schematic diagram showing an operation of the memory 5 when the third transfer process of FIG. 8 is performed. Bank 31-0 includes a memory cell 61-1, a sense amplifier 42A-1 and a sense amplifier 42A-2 included in a certain subarray, and a pair of input/output lines 66-1 of the bank 31-0. The bank 31-5 includes a memory cells 61-2, a sense amplifier 42A-3, a sense amplifier 42A-4 included in a certain subarray, and a pair of input/output lines 66-2 of a bank 31-5. A read command used in the third transfer process uses address [12:10]=LHH as an address key to distinguish it from a normal read operation. These bits are HLL during the normal operation. When this read command is inputted, data read out from the memory cell 61-1 of the transfer source bank 31-0 and stored in the sense amplifier 42A-2 is sent to the pair of input/output lines 66-1 through inside of the bank 31-0 to the data control circuit 45 of the bank 31-0 and outputted from the data control circuit 45 of the bank 31-0 to the internal data bus 32. Next, a write command used in the third transfer process uses address [12:10]=LHL as an address key to distinguish it from a normal write operation. These bits are also HLL in normal operation. When this write command is inputted, the data control circuit 45 of a transfer destination bank 31-5 does not receive the data inputted from the outside of the memory 5, but transfers the data outputted to the internal data bus 32 in the read operation is taken into a latch circuit 46 of the bank 31-5. A data control circuit 45 of the bank 31-5 reads the data stored in the latch circuit 46 and outputs it to a pair of input/output lines 66-2 of the bank 31-5, and the data is sent to the sense amplifier 42A-4 of the transfer destination and written into the sense amplifier 42A-4. These reading and writing are repeated, and data is transferred between different subarrays 41 in different banks 31-0 and 31-5.

Figure 16:
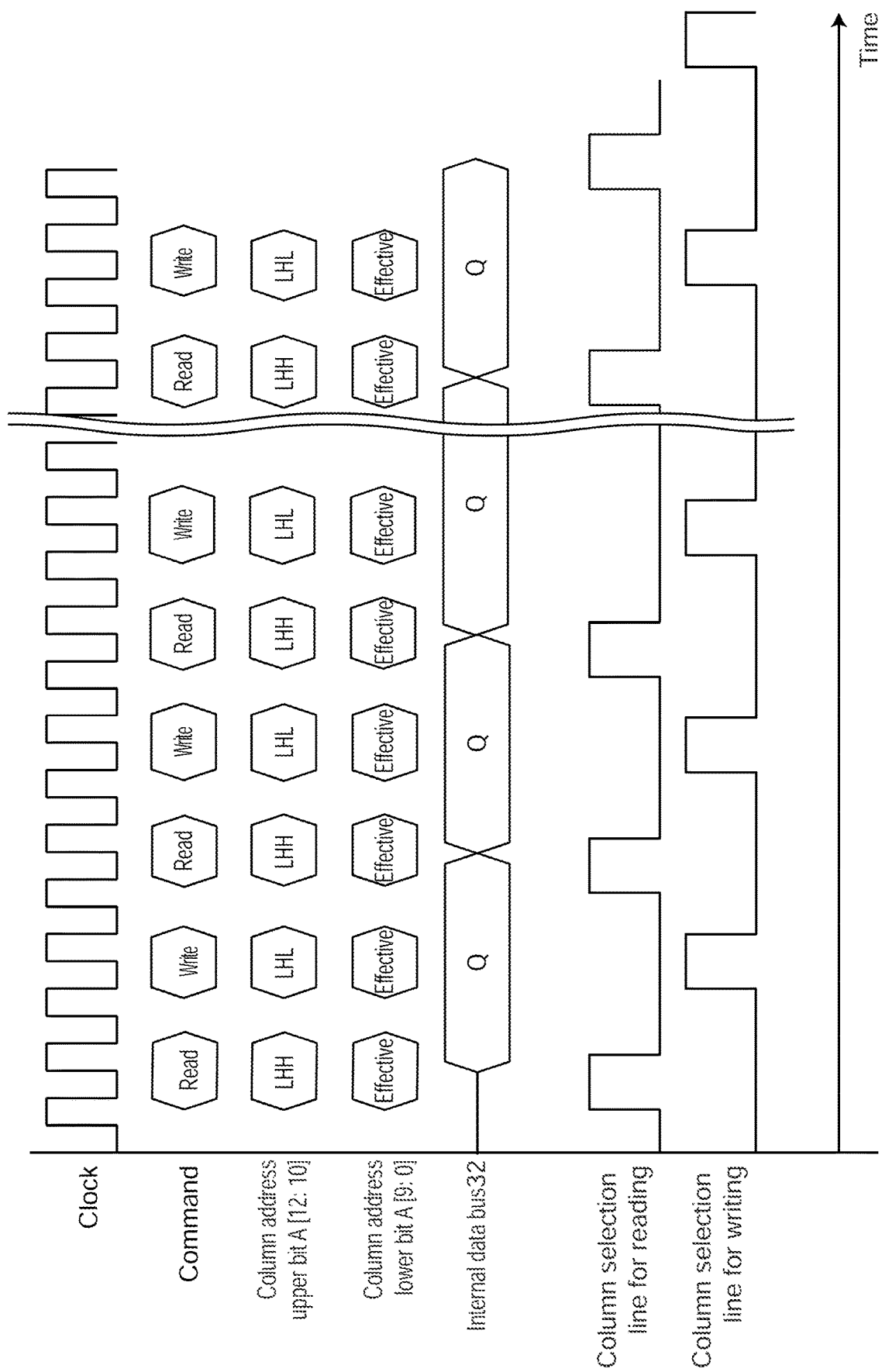
FIG. 16: A timing chart showing an operation of the memory 5 when the third transfer process of FIG. 8 is performed.

FIG. 16 is a timing chart showing an operation of the memory 5 when the third transfer process of FIG. 8 is performed. FIG. 16 shows a sequence of a read command and a write command when transferring data between different subarrays 41 in different banks 31. Similar to FIG. 13, since it is not necessary to output data to the outside of the memory 5 and to input data from the outside of the memory 5, neither the read operation nor the write operation requires a large latency cycle. Thereby, an interval between the read command and the write command can be shortened within an allowable range with respect to the timing of the internal operation of the memory 5.

As described with reference to FIGS. 8 to 16, it is possible to transfer data of a predetermined page in a short time and with low power consumption without transferring data via the memory bus 4 and the processor bus 2.

By the memory system according to the first embodiment, even in the memory 5 and the memory control device 3 having an interface conforming to the JEDEC standard of DDR3-SDRAM, data can be transferred or copied without occupying the memory bus 4 and the processor bus 2 external to the memory 5.

According to the memory system of the first embodiment, when transferring, copying, or initializing a large amount of data in units of pages, which is memory cell data connected to one word line, the data transfer inside the memory 5 does not depend on an address of a transfer source and an address of a transfer destination, and while using a signal group of an interface conforming to the JEDEC standard, without occupying the memory bus 4 and the processor bus 2, and the data transfer inside the memory 5 can be realized in a short time and with low power.

Embodiment 2

As a further embodiment, a case of transferring data between different banks will be described via the register connected to the internal data bus.

Figure 17:
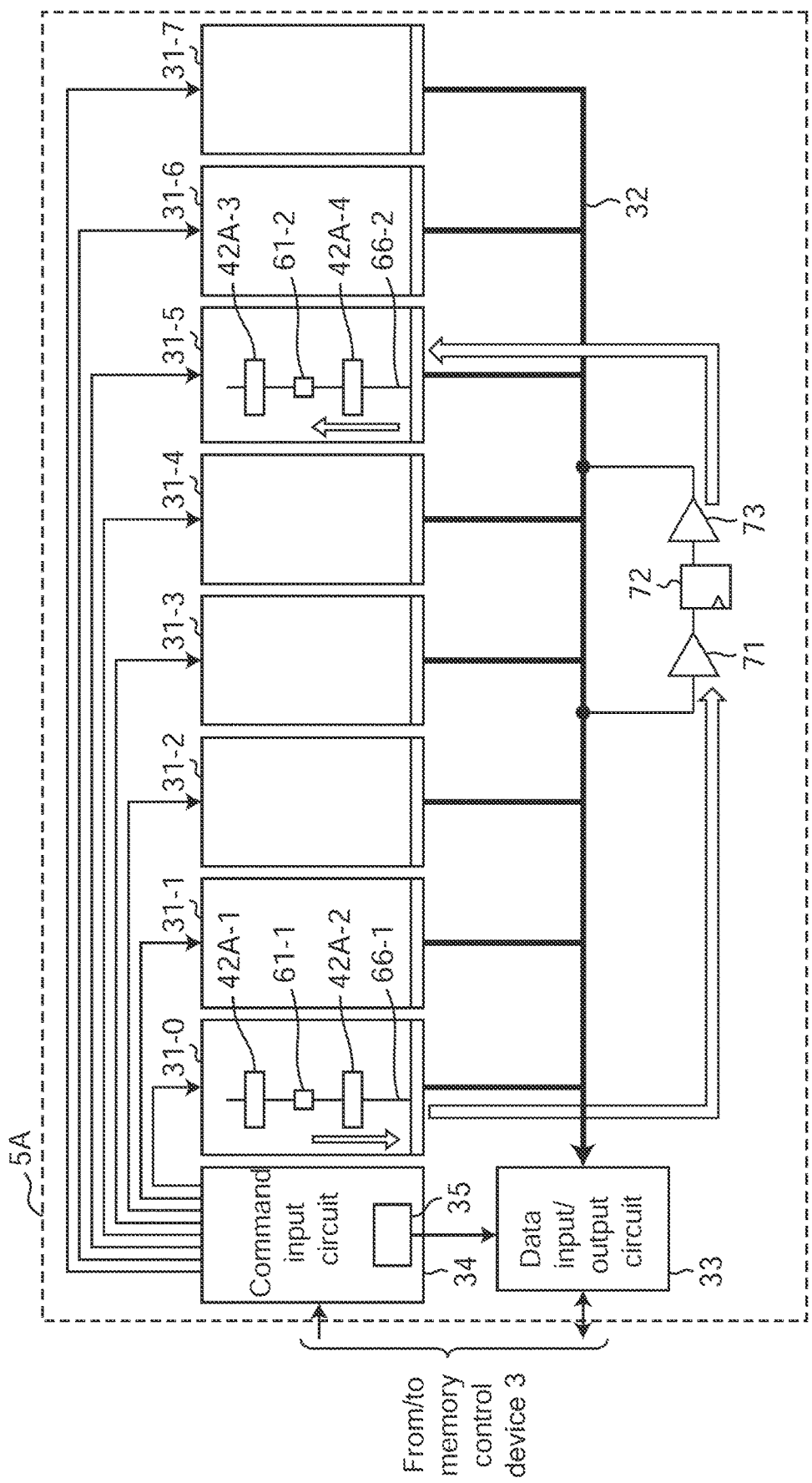
FIG. 17: A block diagram showing a configuration of a memory 5A of a memory system according to a second embodiment.

FIG. 17 is a block diagram showing a configuration of a memory 5A of a memory system according to the second embodiment. Memory 5A further includes a tri-state buffer 71, a tri-state buffer 73 and a register 72 connected to the internal data bus 32, in addition to the components of the memory 5 of FIG. 3. When instructed by the processor 1 to transfer data between different subarrays 41 in different ones of banks 31 among memory banks 31, transfer control circuit 12 of memory control device 3 transmits data via the register 72.

The transfer control circuit 12 of the memory control device 3 collates a transfer source address, that is "bank address plus row address", a transfer destination address, that is "bank address plus row address", and subarray information, and then, judges that the transfer source bank and the transfer destination bank are different each other. As described above, the transfer control circuit 12 transmits the MRS command, a bank address BA [2:0]=HHH, and an address bit A12=H to the memory 5A. Thereby, the memory control device 3 and the memory 5A make a transition from the normal mode to the transfer mode. Next, the transfer control circuit 12 transmits the ACT command and an address of the transfer source to the memory 5A, and further transmits the ACT command and an address of the transfer destination to the memory 5A after a predetermined time interval. Thereafter, while incrementing the column address, reading and writing for the same column address are repeated. After accessing the addresses corresponding to all column selection lines, the transfer control circuit 12 waits for a time period required for restoration by the memory cells 61 of the transfer destination. The transfer control circuit 12 issues the PCG command of the JEDEC standard, thereby completing the data transfer. Thereafter, the transfer control circuit 12 transmits the MRS command, a bank address BA [2:0]=HHH, and an address bit A12=L to the memory 5A. Thereby, the memory control device 3 and the memory 5A return from the transfer mode to the normal mode.

However, in the second embodiment, an operation of the memory 5A when receiving a read command and a write command, that is, a transfer read command and a transfer write command, is different from the operation, normal operation, of the memory of the conventional DDR-SDRAM.

A read command used in the second embodiment uses an address [12:10]=HHH as an address key to distinguish it from a normal read operation. These three bits are HLL during normal operation. When this read command is inputted, data read from the memory cell 61-1 of the transfer source bank 31-0 and stored in the sense amplifier 42A-2 is sent to the pair of input/output lines 66-1 through inside of the bank to the data control circuit 45 of the bank 31-0 and output from the data control circuit 45 of the bank 31-0 to the internal data bus 32. The data outputted to the internal data bus 32 is stored in the register 72 connected to the internal data bus 32. Next, a write command used in the second embodiment uses an address [12:10]=HHL as an address key to distinguish it from a normal write operation. These bits are also HLL in the normal operation. When this write command is inputted, the data control circuit 45 of the transfer destination bank 31-5 latches the data stored in the register 72, not data inputted from outside of the memory 5A, to a latch circuit 46 of the bank 31-5. The data control circuit 45 of the bank 31-5 reads the data stored in the latch circuit 46 and outputs it to the pair of input/output lines 66-2 of the bank 31-5, and the data is sent to the sense amplifier 42A-4 of the transfer destination. These reading and writing are repeated, and data is transferred between different subarrays 41 in different banks 31-0 and 31-5.

Also in the second embodiment, the same effect as in the third transfer process of the first embodiment can be obtained; transferring data of a predetermined page in a short time with low power consumption without transferring data via the memory bus 4 and the processor bus 2 is possible.

According to the memory system of the second embodiment, a plurality of registers connected to the internal data bus 32 of the memory 5A can be provided.

Embodiment 3

Figure 18:
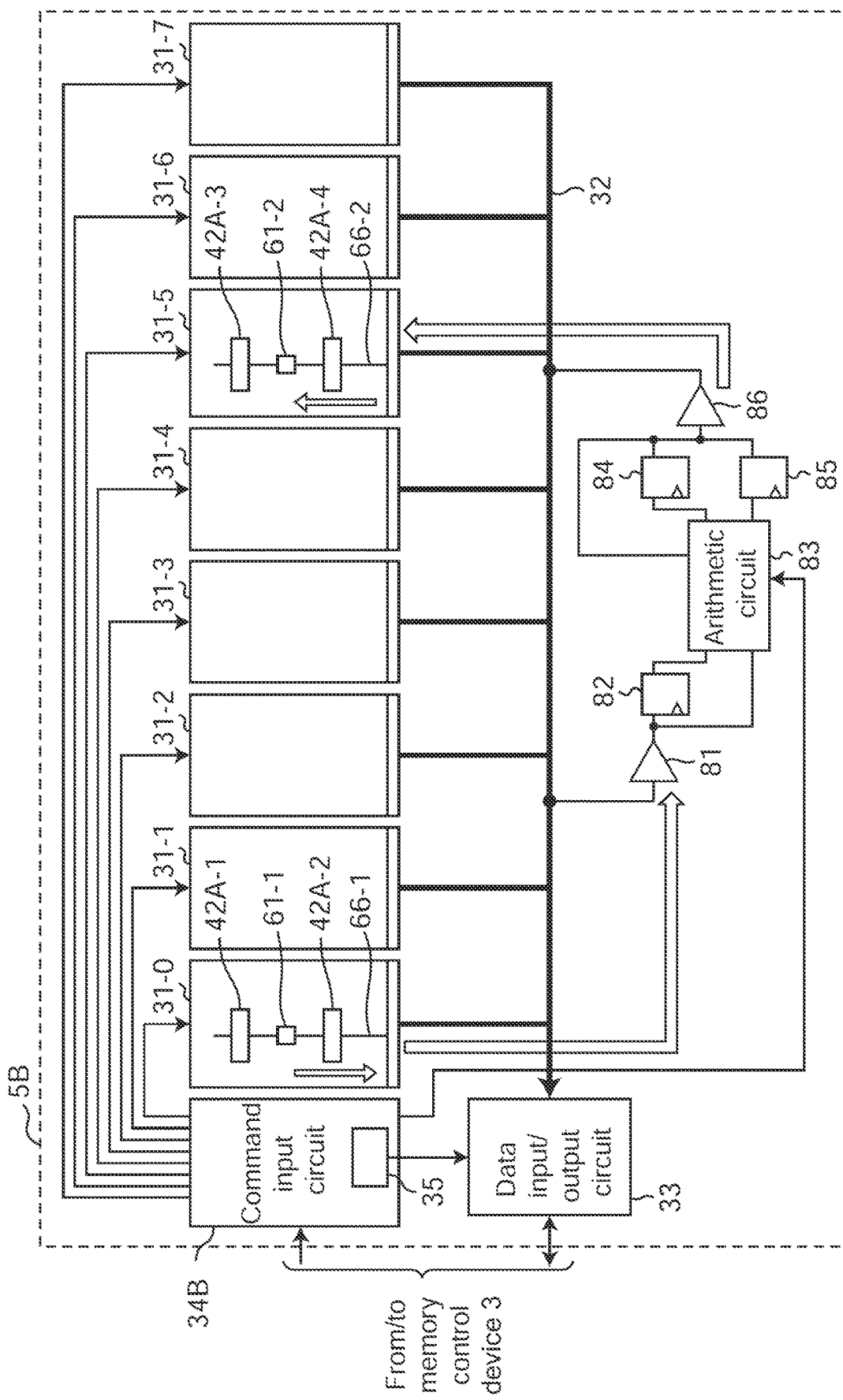
FIG. 18: A block diagram showing a configuration of a memory 5B of a memory system according to a third embodiment.

As a further development of the second embodiment, an arithmetic circuit and/or another register can be placed before a register connected to the internal data bus 32, as shown in FIG. 18.

FIG. 18 is a block diagram showing a configuration of the memory 5B of a memory system according to the third embodiment. The memory 5B comprises tristate buffers 81 and 86 connected to the internal data bus 32, and further comprises registers 82, 84 and 85, and an arithmetic circuit 83. The transfer control circuit 12 of the memory control device 3 executes an operation on data read from one of the plurality of banks 31 by an operation circuit 83, and the data after the operation is written to one of the plurality of banks 31.

The memory control device 3 transmits the MRS command according to the JEDEC standard to the memory 5B and the operation code for the operation of the arithmetic circuit 83 is transmitted to the memory 5B via a signal line of an address in a command bus of the memory bus 4.

FIG. 19 is a table showing operations according to write commands and read commands transmitted from the memory control device 3 in the memory 5B of FIG. 18. By using upper bits of a column address of a write command and a read command as "address keys", data transfers between the memory control device 3, banks 31-0 to 31-7, register 84, etc. is distinguish, and appropriate operation can be achieved depending on the transfer source and the transfer destination.

Figure 20:
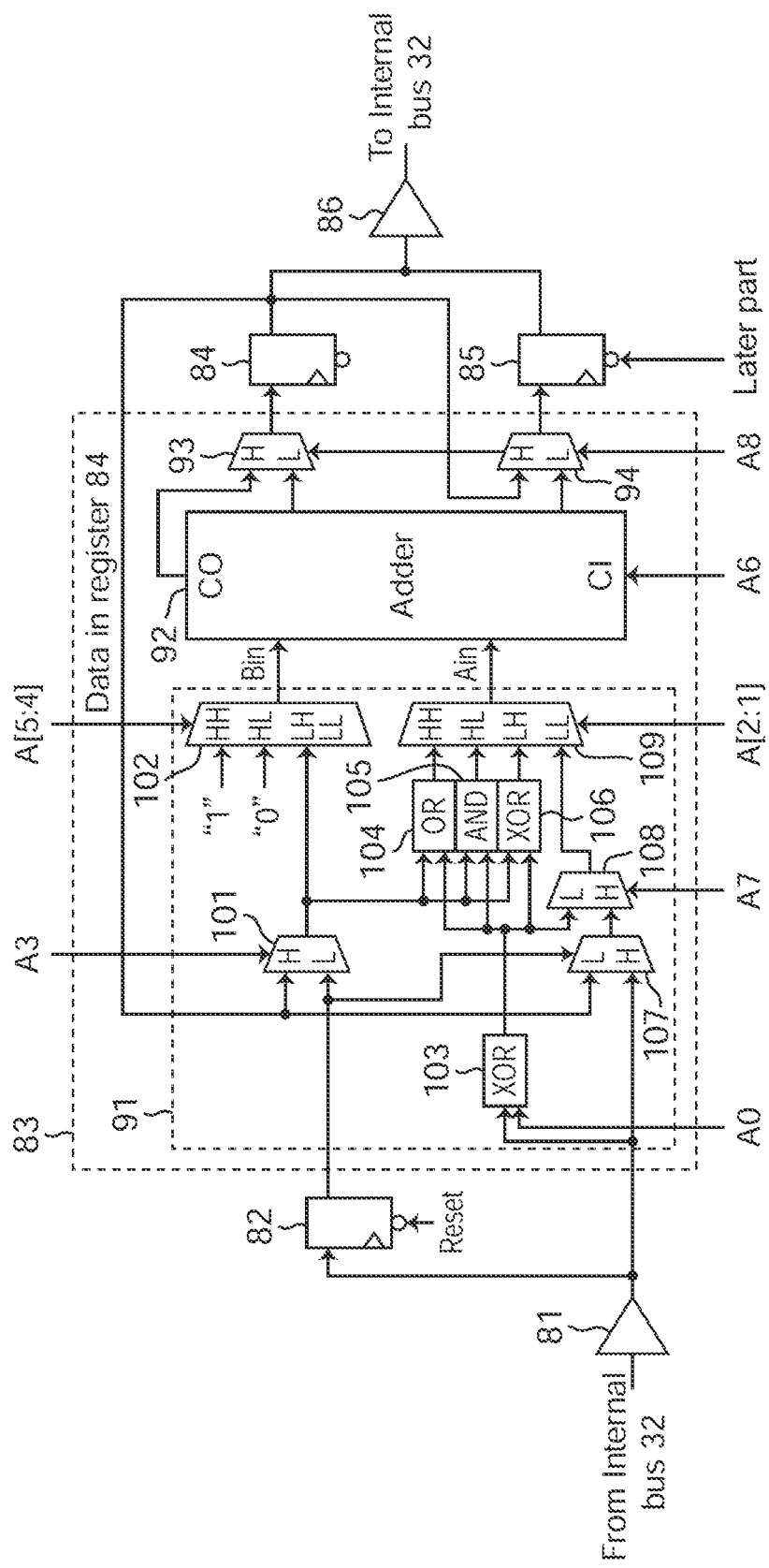
FIG. 20: A block diagram showing a configuration of an arithmetic circuit 83 of FIG. 18.

FIG. 20 is a block diagram showing a configuration of the arithmetic circuit 83 of FIG. 18. The arithmetic circuit 83 includes a logic circuit 91, an adder 92, and selectors 93 and 94. The logic circuit 91 includes selectors 101, 102, 107, 108 and 109, exclusive OR operation circuits 103 and 106, an OR operation circuit 104, and an AND operation circuit 105. The operations of an adder 92, the selectors 94, 101, 102, 108, 109, and the exclusive OR operation circuit 103 change, for example, according to the bits of the address transmitted together with the MRS command from the memory control device 3.

Figure 21:
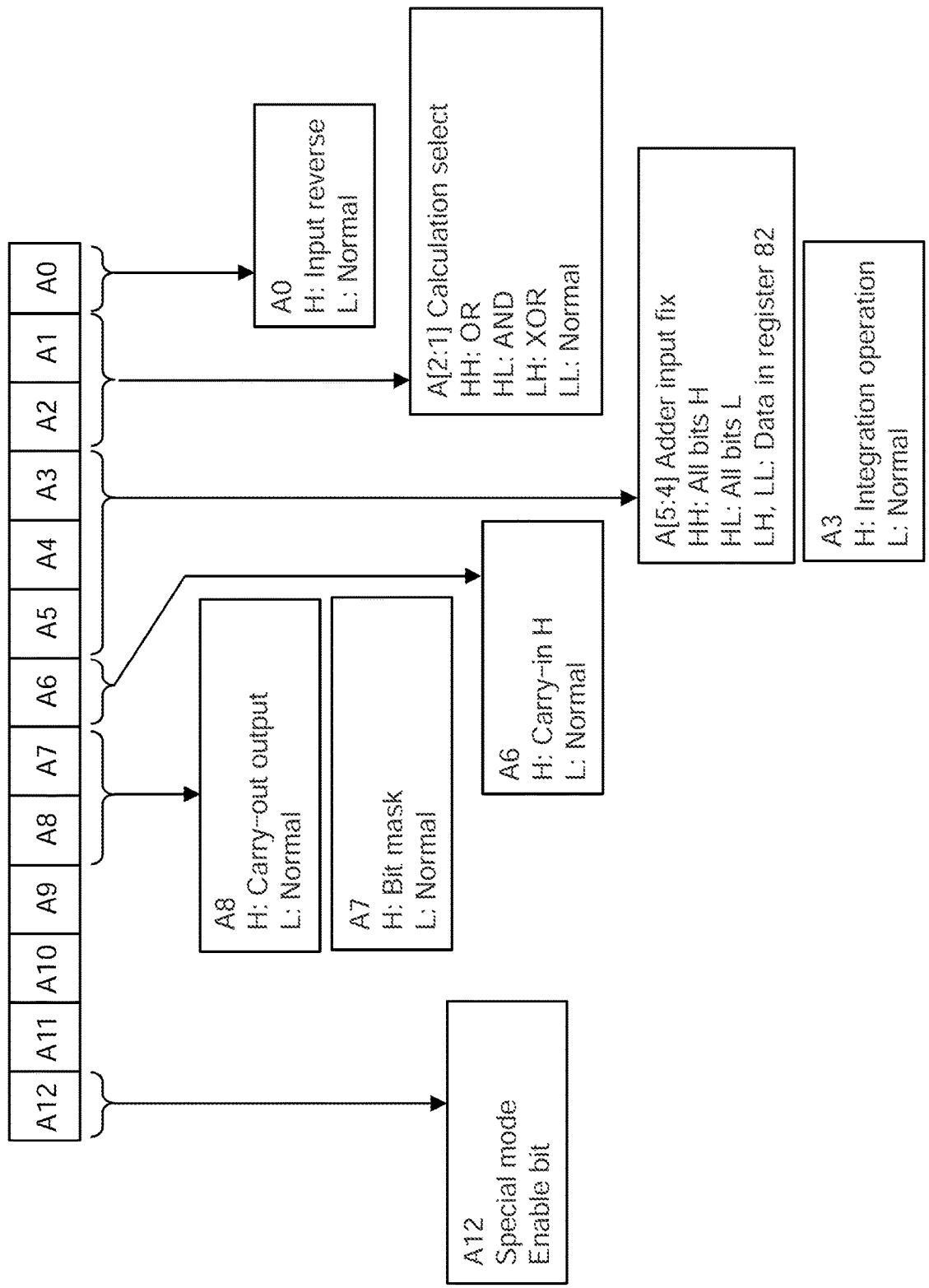
FIG. 21: A diagram showing bits of an address transmitted together with a mode register set command from the memory control device 3 in the memory 5B of FIG. 18.

FIG. 21 is a diagram showing bits of an address transmitted together with the MRS command from the memory control device 3 in the memory 5B of FIG. 18. When receiving an MRS command, a bank address BA [2:0]=HHH, and an address A [12:0] from the memory control device 3, the memory 5B inputs signals designated by each bit of the address A [12:0] to the arithmetic circuit 83.

According to the memory system according to the third embodiment, calculation results obtained by the arithmetic circuit 83 of the memory 5B performing various calculations on data read from an address in the memory 5B can be transferred to the same address or a different address inside the memory 5B.

According to the memory system of the third embodiment, in addition to the same effects as those of the first and second embodiments, it is possible to initialize and calculate the memory 5B in a short time and with a small power.

Modified Example

The embodiments described herein describe in detail the mode register setting, command system and sequence in a case where one bank is divided into eight subarrays using 1 Gb DDR3-SDRAM, however, the invention is also applicable to a case of using other memories of DDRx-SDRAM and LPDDRx-SDRAM (eg, DDR4-SDRAM, LPDDR4-SDRAM, etc.). Even when using a signal group conforming to the JEDEC standard, mode register settings, command systems and sequences, for example, using "reserved for users" commands and addresses, etc., which are different from the embodiment described above, a memory system similar to the described embodiment can be realized. Further, it goes without saying that the embodiments described in the present specification can be similarly applied to cases where the memory capacity and/or the number of subarrays dividing the bank are different.

INDUSTRIAL APPLICABILITY

According to the invention, a memory and memory control device having an interface conforming to the JEDEC standard of DDRx-SDRAM or LPDDRx-SDRAM, which can transfer or copy data without occupying a bus outside the memory, a memory control device, and further, a memory system including these can be provided.

The invention is particularly applicable to a memory system that is required to transfer a large amount of data smoothly inside a memory.

It is to be understood that these embodiments are not meant as limitations of the invention but merely exemplary descriptions of the invention with regard to certain specific embodiments. Indeed, different adaptations may be apparent to those skilled in the art without departing from the scope of the annexed claims. For instance, it is possible to add bus buffers on a specific data bus if it is necessary. Moreover, it is still possible to have a plurality of bus buffers cascaded in series.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention (s), and their equivalents, that are protected thereby. In all instances, the scope of such claims shall be considered on their own merits in light of this disclosure, but should not be constrained by the headings herein.

What is claimed is:

1. A control device for a semiconductor memory device comprising an interface conforming to JEDEC (Joint Electron Device Engineering Council) standard of DDRx-SDRAM or LPDDRx-SDRAM, the semiconductor memory device comprising:
   a plurality of banks, connected to one another by an internal data bus, and each bank being separated from one another by at least one sense amplifier row comprising a plurality of sense amplifiers, each bank comprising a plurality of subarrays, and each subarray comprising a plurality of memory cells arranged along a plurality of bit lines and a plurality of word lines orthogonal to the bit lines;
   a read/write control circuit, controlling reading of data from the semiconductor memory device and writing of data to the semiconductor memory device; and
   a transfer control circuit, controlling data transfer inside the semiconductor memory device and setting to enable an additional transfer command not specified in the JEDEC standard and a transfer command for writing data, read from a transfer source memory cell, to a transfer destination memory cell without passing outside the semiconductor memory device by transmitting a first signal value not used in the JEDEC standard to the semiconductor memory device via at least one signal line of the interface;
   wherein the transfer command comprises a word line activation command for activating a word line without activating the sense amplifiers, and the transfer control circuit invalidates a ZQ calibration command of the JEDEC standard, and sets a bit value assigned to the ZQ calibration command to be usable as a bit value of the word line activation command.

2. The control device according to claim 1, wherein the transfer control circuit further transmits the first signal value to the semiconductor memory device via a signal line of a bank address of the interface when transmitting a mode register set command of the JEDEC standard to the semiconductor memory device.

3. The control device according to claim 1, wherein when the transfer control circuit transfers data inside one of the subarrays in one of the banks, the transfer control circuit transmits a activation command of the JEDEC standard to the semiconductor memory device for activating a word line and the sense amplifiers of one of the subarrays comprising the activated word line and a row address of the word line that contains the transfer source memory cell, and the word line activation command and a row address of a word line comprising the transfer destination memory cell to the semiconductor memory device, and further a pre-charge command of the JEDEC standard to the semiconductor memory device.

4. The control device according to one of claim 1, wherein the semiconductor memory device further comprises at least one register connected to the internal data bus, and the transfer control circuit transfers data via the register when transferring data between different subarrays in different banks.

5. The control device according to one of claim 1, wherein the semiconductor memory device further comprises at least one register and an arithmetic circuit connected to the internal data bus, and the transfer control circuit performs an operation on data, read from one of the banks by the arithmetic circuit, and writes data after the operation to one of the banks.

6. The control device according to claim 5, wherein when transmitting a mode register set command of the JEDEC standard to the semiconductor memory device, the arithmetic circuit transmits an operation code of operation by the arithmetic circuit to the semiconductor memory device through an address signal line of the interface.

7. A semiconductor memory device, comprising an interface conforming to JEDEC (Joint Electron Device Engineering Council) standard of DDRx-SDRAM or LPDDRx-SDRAM, the semiconductor memory device comprising:
   an internal bus;
   a plurality of banks, connected to one another by the internal data bus, and each of the banks being separated from one another by at least one sense amplifier row comprising a plurality of sense amplifiers, each of the banks comprising a plurality of subarrays, and each of the subarrays comprising a plurality of memory cells arranged along a plurality of bit lines and a plurality of word lines orthogonal to the bit lines;
   a data input/output circuit, connected to a control device via the interface and connected to the banks via the internal data bus, transmitting/receiving data between the control device and the banks; and
   a command input circuit, connected to the control device via the interface and receiving a command for controlling the banks from the control device;
   wherein the command input circuit, by receiving a first signal value not used in the JEDEC standard from the control device via at least one signal line of the interface, enables an additional transfer command which is not defined in the JEDEC standard but is a transfer command to write data, read from a transfer source memory cell, to a transfer destination memory cell without passing outside the semiconductor memory device, the transfer command comprises a word line activation command for activating a word line without activating the sense amplifiers, and the command input circuit invalidates a ZQ calibration command of the JEDEC standard, and sets a bit value assigned to the ZQ calibration command to be usable as a bit value of the word line activation command.

8. The semiconductor memory device according to claim 7, wherein the command input circuit receives the first signal value from the control device via a signal line of a bank address of the interface when receiving a mode register set command of the JEDEC standard from the control device.

9. The semiconductor memory device according to claim 7, wherein commands and addresses received by the command input circuit from the control device comprise:
an activation command of the JEDEC standard, for activating a word line and the sense amplifiers of a subarray including the activated word line;
a row address of word line comprising a memory cell of a transfer source;
the word line activation command;
a row address of a word line comprising a memory cell of a transfer destination; and
a pre-charge command of the JEDEC standard;
thereby, data is transferred within one of the subarrays in one of the banks.

10. The semiconductor memory device according to claim 7, wherein the semiconductor memory device further comprises at least one register connected to the internal data bus, and the command input circuit transfers data via the register when transferring data between different subarrays in different banks.

11. The semiconductor memory device according to claim 7, wherein the semiconductor memory device further comprises at least one register and an arithmetic circuit connected to the internal data bus, and the command input circuit performs an operation on data, read from one of the banks by the arithmetic circuit, and writes the data after the operation to one of the banks.

12. The semiconductor memory device according to claim 11, wherein when the arithmetic circuit receives a mode register set command of the JEDEC standard from the control device, the arithmetic circuit receives an operation code of the operation by the arithmetic circuit from the control device via the signal line of the address of the interface.

13. A control method for a semiconductor memory device comprising an interface conforming to JEDEC (Joint Electron Device Engineering Council) standard of DDRx-SDRAM or LPDDRx-SDRAM and a plurality of banks connected to one another by an internal data bus, each bank being separated from one another by at least one sense amplifier row comprising a plurality of sense amplifiers, each bank comprising a plurality of subarrays, and each subarray comprising a plurality of memory cells arranged along a plurality of bit lines and a plurality of word lines orthogonal to the bit lines, the control method comprising steps of:
enabling an additional transfer command not specified in the JEDEC standard and a transfer command to write data, read from a transfer source memory cell, to a transfer destination memory cell without passing outside the semiconductor memory device by receiving from a control device a first signal value not used in the JEDEC standard via at least one signal line of the interface; and
receiving subarray information indicating a range of row addresses comprised in each of the subarrays in each of the banks from the semiconductor memory device via at least one signal line of the interface.

14. A control device for a semiconductor memory device comprising an interface conforming to JEDEC (Joint Electron Device Engineering Council) standard of DDRx-SDRAM or LPDDRx-SDRAM, the semiconductor memory device comprising:
a plurality of banks, connected to one another by an internal data bus, and each bank being separated from one another by at least one sense amplifier row comprising a plurality of sense amplifiers, each bank comprising a plurality of subarrays, and each subarray comprising a plurality of memory cells arranged along a plurality of bit lines and a plurality of word lines orthogonal to the bit lines;
a read/write control circuit, controlling reading of data from the semiconductor memory device and writing of data to the semiconductor memory device; and
a transfer control circuit, controlling data transfer inside the semiconductor memory device and setting to enable an additional transfer command not specified in the JEDEC standard and a transfer command for writing data, read from a transfer source memory cell, to a transfer destination memory cell without passing outside the semiconductor memory device by transmitting a first signal value not used in the JEDEC standard to the semiconductor memory device via at least one signal line of the interface;
wherein the transfer control circuit further transmits the first signal value to the semiconductor memory device via a signal line of a bank address of the interface when transmitting a mode register set command of the JEDEC standard to the semiconductor memory device, and the transfer command comprises a sense amplifier activation command for activating the sense amplifiers of one of the subarrays without activating a word line.

15. The control device according to claim 14, wherein when transmitting the mode register set command of the JEDEC standard to the semiconductor memory device by transmitting a second signal value to the semiconductor memory device via the signal line of the bank address of the interface, the transfer control circuit sets a bit value assigned to the mode register set command to be usable as a bit value of the sense amplifier activation command.

16. A control device for a semiconductor memory device comprising an interface conforming to JEDEC (Joint Electron Device Engineering Council) standard of DDRx-SDRAM or LPDDRx-SDRAM, the semiconductor memory device comprising:
a plurality of banks, connected to one another by an internal data bus, and each bank being separated from one another by at least one sense amplifier row comprising a plurality of sense amplifiers, each bank comprising a plurality of subarrays, and each subarray comprising a plurality of memory cells arranged along a plurality of bit lines and a plurality of word lines orthogonal to the bit lines;
a read/write control circuit, controlling reading of data from the semiconductor memory device and writing of data to the semiconductor memory device; and
a transfer control circuit, controlling data transfer inside the semiconductor memory device and setting to enable an additional transfer command not specified in the JEDEC standard and a transfer command for writing data, read from a transfer source memory cell, to a transfer destination memory cell without passing outside the semiconductor memory device by transmitting a first signal value not used in the JEDEC standard to the semiconductor memory device via at least one signal line of the interface;
wherein the transfer command further includes a transfer read command and a transfer write command for writing data read from a memory cell of a transfer source subarray into a memory cell of a transfer destination subarray without passing through outside of the semiconductor memory device.

17. The control device according to claim 16, wherein the transfer control circuit disables burst chops and auto pre-charge of read and write commands of the JEDEC standard, and when the read and write commands of the JEDEC standard are transmitted to the semiconductor memory device, the transfer control circuit sets bit values assigned to the read command of the JEDEC standard and the write command of the JEDEC standard to be usable as bit values of the transfer read command and the transfer write command by transmitting a third signal value to the semiconductor memory device via at least one of the signal lines of a column address of the interface, respectively.

18. The control device according to claim 16, wherein the transfer command further comprises a word line activation command that activates a word line without activating the sense amplifiers, and a sense amplifier activation command that activates the sense amplifiers of one of the subarrays without activating a word line, and when transferring data between different subarrays in one of the banks, commands and addresses submitted by the transfer control circuit to the semiconductor memory device comprise:
- a activation command of the JEDEC standard, for activating a word line and the sense amplifiers of one of the subarrays comprising the activated word line;
- a row address of the word line comprising the transfer source memory cell;
- the sense amplifier activation command;
- a row address of the sense amplifiers of one of the subarrays comprising another word line comprising the transfer destination memory cell;
- the transfer read command and a column address;
- the transfer write command and another column address;
- the word line activation command and a row address of the word line comprising the transfer destination memory cell; and
- a pre-charge command of the JEDEC standard.

19. The control device according to claim 16, wherein, when transferring data between different subarrays in different banks, commands and addresses transmitted by the transfer control circuit transmits to the semiconductor memory device comprise:
- an activation command of the JEDEC standard, for activating a word line and the sense amplifiers of one of the subarrays comprising the activated word line;
- a row address of a word line comprising the transfer source memory cell,
- a row address of a word line comprising the activation command of the JEDEC standard and the transfer destination memory cell;
- the transfer read command and a column address;
- the transfer write command and another column address;
- a pre-charge command of the JEDEC standard.

20. A control device for a semiconductor memory device comprising an interface conforming to JEDEC (Joint Electron Device Engineering Council) standard of DDRx-SDRAM or LPDDRx-SDRAM, the semiconductor memory device comprising:
- a plurality of banks, connected to one another by an internal data bus, and each bank being separated from one another by at least one sense amplifier row comprising a plurality of sense amplifiers, each bank comprising a plurality of subarrays, and each subarray comprising a plurality of memory cells arranged along a plurality of bit lines and a plurality of word lines orthogonal to the bit lines;
- a read/write control circuit, controlling reading of data from the semiconductor memory device and writing of data to the semiconductor memory device; and
- a transfer control circuit, controlling data transfer inside the semiconductor memory device and setting to enable an additional transfer command not specified in the JEDEC standard and a transfer command for writing data, read from a transfer source memory cell, to a transfer destination memory cell without passing outside the semiconductor memory device by transmitting a first signal value not used in the JEDEC standard to the semiconductor memory device via at least one signal line of the interface;
- wherein the transfer control circuit receives subarray information indicating a range of row addresses comprised in each of the subarrays in each of the banks from the semiconductor memory device via at least one signal line of the interface.

21. The control device according to claim 20, wherein the transfer control circuit receives the subarray information from a multipurpose register of the semiconductor memory device using a mode register read command of the JEDEC standard.

22. The control device according to claim 20, wherein the subarray information comprises a number of row addresses comprised in a cycle of one or more of the subarrays periodically arranged in each one of the banks, and another number of row addresses from a beginning of the cycle to a beginning of each subarray included in the cycle.

23. The control device according to claim 20, wherein the transfer control circuit comprising:
- a transfer source address register, storing a bank address and a row address of a transfer source bank received from a processor connected to the transfer control circuit,
- a transfer destination address register, storing a bank address and a row address of a transfer destination bank received from the processor,
- a transfer page number register, storing a number of pages of transfer data received from the processor;
- a subarray information register, storing the subarray information received from the semiconductor memory device; and
- an address comparison circuit, determining whether to transfer data within a same subarray and whether to transfer data within a same bank based on information stored in the transfer source address register, the transfer destination address register, the transfer page number register and the subarray information register.

24. A control device for a semiconductor memory device comprising an interface conforming to JEDEC (Joint Electron Device Engineering Council) standard of DDRx-SDRAM or LPDDRx-SDRAM, the semiconductor memory device comprising:
- a plurality of banks, connected to one another by an internal data bus, and each bank being separated from one another by at least one sense amplifier row comprising a plurality of sense amplifiers, each bank comprising a plurality of subarrays, and each subarray comprising a plurality of memory cells arranged along a plurality of bit lines and a plurality of word lines orthogonal to the bit lines;
- a read/write control circuit, controlling reading of data from the semiconductor memory device and writing of data to the semiconductor memory device; and
- a transfer control circuit, controlling data transfer inside the semiconductor memory device and setting to enable an additional transfer command not specified in the JEDEC standard and a transfer command for writing data, read from a transfer source memory cell, to a transfer destination memory cell without passing outside the semiconductor memory device by transmitting a first signal value not used in the JEDEC standard to the semiconductor memory device via at least one signal line of the interface;
wherein the transfer control circuit comprises a transfer start trigger register storing a transfer start trigger received from a processor connected to the transfer control circuit, and a selector connecting one of the read/write control circuit and the transfer control circuit to the semiconductor memory device according to presence or absence of the transfer start trigger stored in the transfer start trigger register.

25. A semiconductor memory device, comprising an interface conforming to JEDEC (Joint Electron Device Engineering Council) standard of DDRx-SDRAM or LPDDRx-SDRAM, the semiconductor memory device comprising:
an internal bus;
a plurality of banks, connected to one another by the internal data bus, and each of the banks being separated from one another by at least one sense amplifier row comprising a plurality of sense amplifiers, each of the banks comprising a plurality of subarrays, and each of the subarrays comprising a plurality of memory cells arranged along a plurality of bit lines and a plurality of word lines orthogonal to the bit lines;
a data input/output circuit, connected to a control device via the interface and connected to the banks via the internal data bus, transmitting/receiving data between the control device and the banks; and
a command input circuit, connected to the control device via the interface and receiving a command for controlling the banks from the control device;
wherein the command input circuit, by receiving a first signal value not used in the JEDEC standard from the control device via at least one signal line of the interface, enables an additional transfer command which is not defined in the JEDEC standard but is a transfer command to write data, read from a transfer source memory cell, to a transfer destination memory cell without passing outside the semiconductor memory device, and the transfer command comprises a sense amplifier activation command for activating the sense amplifiers of a subarray without activating a word line.

26. The semiconductor memory device according to claim 25, wherein when the command input circuit receives a mode register set command of the JEDEC standard from the control device, and by receiving a second signal value from the control device via a signal line of a bank address of the interface, the command input circuit sets a bit value assigned to the mode register set command to be usable as a bit value of the sense amplifier activation command.

27. A semiconductor memory device, comprising an interface conforming to JEDEC (Joint Electron Device Engineering Council) standard of DDRx-SDRAM or LPDDRx-SDRAM, the semiconductor memory device comprising:
an internal bus;
a plurality of banks, connected to one another by the internal data bus, and each of the banks being separated from one another by at least one sense amplifier row comprising a plurality of sense amplifiers, each of the banks comprising a plurality of subarrays, and each of the subarrays comprising a plurality of memory cells arranged along a plurality of bit lines and a plurality of word lines orthogonal to the bit lines;
a data input/output circuit, connected to a control device via the interface and connected to the banks via the internal data bus, transmitting/receiving data between the control device and the banks; and
a command input circuit, connected to the control device via the interface and receiving a command for controlling the banks from the control device;
wherein the command input circuit, by receiving a first signal value not used in the JEDEC standard from the control device via at least one signal line of the interface, enables an additional transfer command which is not defined in the JEDEC standard but is a transfer command to write data, read from a transfer source memory cell, to a transfer destination memory cell without passing outside the semiconductor memory device, and the transfer command further comprises a transfer read command and a transfer write command for writing data, read from a memory cell of a transfer source subarray, into a memory cell of a transfer destination subarray without passing through outside of the semiconductor memory device.

28. The semiconductor memory device according to claim 27, wherein the command input circuit is configured to:
invalidate burst chops and auto pre-charge of read and write commands of the JEDEC standard;
receive the read and write commands of the JEDEC standard from the control device; and
by receiving a third signal value from the control device via at least one of the plurality of signal lines of the column address of the interface, setting bit values assigned to the read and write commands of the JEDEC standard to be usable as bit values of the transfer read command and the transfer write command, respectively.

29. The semiconductor memory device according to claim 27, wherein the transfer command further comprises a word line activation command that activates a word line without activating the sense amplifiers, and a sense amplifier activation command for activating the sense amplifiers of a subarray without activating a word line, and commands and addresses received by the command input circuit from the control device comprise:
an activation command of the JEDEC standard, for activating a word line and a sense amplifier of a subarray comprising the activated word line;
a row address of a word line comprising the transfer source memory cell;
the sense amplifier activation command and a row address of a sense amplifier of a subarray comprising a word line comprising the transfer destination memory cell;
the transfer read command and a column address;
the transfer write command and another column address;
the word line activation command and a row address of a word line comprising the transfer destination memory cell; and
a pre-charge command of the JEDEC standard;
thereby, data is transferred between different subarrays in one of the banks and within one of the subarrays in one of the banks.

30. The semiconductor memory device according to claim 27, wherein commands and addresses received by the command input circuit from the control device comprise:
an activation command of the JEDEC standard, for activating a word line and a sense amplifier of a subarray comprising the activated word line and a row address of a word line comprising the transfer source memory cell;
the activation command and a row address of a word line comprising the transfer destination memory cell;

the transfer read command and a column address;
the transfer write command and another column address; and
a pre-charge command of the JEDEC standard;
thereby, data is transferred between different subarrays in different banks.

31. A semiconductor memory device, comprising an interface conforming to JEDEC (Joint Electron Device Engineering Council) standard of DDRx-SDRAM or LPDDRx-SDRAM, the semiconductor memory device comprising:
an internal bus;
a plurality of banks, connected to one another by the internal data bus, and each of the banks being separated from one another by at least one sense amplifier row comprising a plurality of sense amplifiers, each of the banks comprising a plurality of subarrays, and each of the subarrays comprising a plurality of memory cells arranged along a plurality of bit lines and a plurality of word lines orthogonal to the bit lines;
a data input/output circuit, connected to a control device via the interface and connected to the banks via the internal data bus, transmitting/receiving data between the control device and the banks; and
a command input circuit, connected to the control device via the interface and receiving a command for controlling the banks from the control device;
wherein the command input circuit, by receiving a first signal value not used in the JEDEC standard from the control device via at least one signal line of the interface, enables an additional transfer command which is not defined in the JEDEC standard but is a transfer command to write data, read from a transfer source memory cell, to a transfer destination memory cell without passing outside the semiconductor memory device, and the command input circuit transmits subarray information indicating a range of row addresses comprised in each of the subarrays in each of the banks to the control device via at least one signal line of the interface.

32. The semiconductor memory device according to claim 31, wherein the command input circuit transmits the subarray information stored in a multipurpose register of the semiconductor memory device to the control device in response to a mode register read command of the JEDEC standard.

33. The semiconductor memory device according to claim 31, wherein the subarray information comprises a number of row addresses comprised in a cycle of one or more of the subarrays periodically arranged in each of the banks and a number of row addresses from the beginning of the cycle to the beginning of each subarray comprised in the cycle.

* * * * *